US010026609B2

(12) United States Patent
Sreenivasan et al.

(10) Patent No.: US 10,026,609 B2
(45) Date of Patent: Jul. 17, 2018

(54) NANOSHAPE PATTERNING TECHNIQUES THAT ALLOW HIGH-SPEED AND LOW-COST FABRICATION OF NANOSHAPE STRUCTURES

(71) Applicant: Board of Regents, The University of Texas System, Austin, TX (US)

(72) Inventors: Sidlgata V. Sreenivasan, Austin, TX (US); Anshuman Cherala, Austin, TX (US); Meghali Chopra, Austin, TX (US); Roger Bonnecaze, Austin, TX (US); Ovadia Abed, Austin, TX (US); Bailey Yin, Austin, TX (US); Akhila Mallavarapu, Austin, TX (US); Shrawan Singhal, Austin, TX (US); Brian Gawlik, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/921,866

(22) Filed: Oct. 23, 2015

(65) Prior Publication Data
US 2016/0118249 A1  Apr. 28, 2016

Related U.S. Application Data

(60) Provisional application No. 62/067,496, filed on Oct. 23, 2014.

(51) Int. Cl.
*H01L 21/02* (2006.01)
*G03F 7/00* (2006.01)
(Continued)

(52) U.S. Cl.
CPC .... *H01L 21/02521* (2013.01); *B81C 1/00031* (2013.01); *G03F 7/0002* (2013.01);
(Continued)

(58) Field of Classification Search
CPC ............ H01L 21/8086; H01L 21/3086; H01L 21/0228; H01L 21/02381; H01L 21/02617;
(Continued)

(56) References Cited

U.S. PATENT DOCUMENTS 5,772,905 A   6/1998 Chou
7,179,396 B2  2/2007 Sreenivasan
(Continued)

OTHER PUBLICATIONS

Xiuling Li, "Metal Assisted Chemical Etching for High Aspect Ratio Nanostructures: A Review of Characteristics and Applications in Photovoltaics," Current Opinion in Solid State and Materials Science, 2012, vol. 16, No. 2, pp. 71-81.
(Continued)

*Primary Examiner* — Caridad Everhart
(74) *Attorney, Agent, or Firm* — Robert A. Voigt, Jr.; Winstead, P.C.

(57) ABSTRACT

A method for template fabrication of ultra-precise nanoscale shapes. Structures with a smooth shape (e.g., circular cross-section pillars) are formed on a substrate using electron beam lithography. The structures are subject to an atomic layer deposition of a dielectric interleaved with a deposition of a conductive film leading to nanoscale sharp shapes with features that exceed electron beam resolution capability of sub-10 nm resolution. A resist imprint of the nanoscale sharp shapes is performed using J-FIL. The nanoscale sharp shapes are etched into underlying functional films on the substrate forming a nansohaped template with nanoscale sharp shapes that include sharp corners and/or ultra-small gaps. In this manner, sharp shapes can be retained at the nanoscale level. Furthermore, in this manner, imprint based shape control for novel shapes beyond elementary nanoscale structures, such as dots and lines, can occur at the nanoscale level.

30 Claims, 28 Drawing Sheets

(51) Int. Cl.
*H01L 21/308* (2006.01)
*B81C 1/00* (2006.01)
*B82Y 40/00* (2011.01)
*G11B 5/74* (2006.01)
*H01L 29/94* (2006.01)

(52) U.S. Cl.
CPC .. *H01L 21/02381* (2013.01); *H01L 21/02617* (2013.01); *H01L 21/3086* (2013.01); *B81C 2201/0187* (2013.01); *B82Y 40/00* (2013.01); *G11B 5/746* (2013.01); *H01L 29/945* (2013.01); *Y10S 977/887* (2013.01); *Y10S 977/888* (2013.01); *Y10S 977/89* (2013.01)

(58) Field of Classification Search
CPC ............ H01L 21/02521; H01L 29/945; G03F 7/0002; B82Y 40/00; Y10S 977/888; Y10S 977/887; Y10S 977/89; B81C 1/00031; B81C 2201/0187
See application file for complete search history.

(56) References Cited

U.S. PATENT DOCUMENTS

| | | | |
|---|---|---|---|
| 7,261,831 B2 | 8/2007 | Sreenivasan | |
| 7,670,953 B2 | 3/2010 | Sreenivasan | |
| 7,858,528 B2 | 12/2010 | Sreenivasan | |
| 7,947,608 B2 | 5/2011 | Sreenivasan | |
| 8,080,280 B1* | 12/2011 | Grubbs | C23C 16/45525 427/248.1 |
| 8,828,297 B2 | 9/2014 | Sreenivasan et al. | |
| 9,523,148 B1* | 12/2016 | Pore | H01L 21/02186 |
| 2006/0263699 A1* | 11/2006 | Abatchev | H01L 21/0337 430/5 |
| 2007/0215960 A1 | 9/2007 | Zhu et al. | |
| 2007/0264588 A1 | 11/2007 | Sreenivasan et al. | |
| 2008/0099338 A1 | 5/2008 | Cohen | |
| 2008/0143019 A1* | 6/2008 | Chou | B29C 59/022 264/293 |
| 2009/0092927 A1* | 4/2009 | Choi | C23F 1/02 430/314 |
| 2009/0166317 A1* | 7/2009 | Okushima | B82Y 10/00 216/11 |
| 2009/0169663 A1* | 7/2009 | Houle | B82Y 10/00 425/174.4 |
| 2010/0078846 A1* | 4/2010 | Resnick | B82Y 10/00 264/101 |
| 2010/0104852 A1 | 4/2010 | Fletcher et al. | |
| 2010/0167520 A1* | 7/2010 | Chen | H01L 21/0337 438/597 |
| 2011/0042352 A1* | 2/2011 | Okushima | B29C 33/424 216/44 |
| 2012/0133077 A1* | 5/2012 | Mizawa | B29C 33/56 264/293 |
| 2014/0314897 A1* | 10/2014 | Ahn | G03F 7/0002 425/385 |
| 2015/0158268 A1* | 6/2015 | Koike | B32B 3/30 156/247 |

OTHER PUBLICATIONS

Yae et al., "Catalytic Activity of Noble Metals for Metal-Assisted Chemical Etching of Silicon," Nanoscale Research Letters, 2012, vol. 7, No. 352, pp. 1-5.
Cherala et al., "Nanoscale Magnification and Shape Control System for Precision Overlay in Jet and Flash Imprint Lithography," IEEE/ASME Transactions on Mechatronics, vol. 20, No. 1, Feb. 2015, pp. 122-131.
Park et al., "Multispectral Imaging with Vertical Silicon Nanowires," Scientific Reports, vol. 3, Article No. 2460, 2013, pp. 1-6.
Huang et al., "Metal-Assisted Chemical Etching of Silicon: A Review," Advanced Materials, vol. 23, 2011, pp. 285-308.
Chopra et al., "Nanosculpting with Imprint Lithography," presented at Nanoimprint and Nanoprint Technology Conference, Osaka, Japan, Oct. 24, 2014, pp. 1-26.
International Search Report and Written Opinion of the International Searching Authority for International Application No. PCT/US15/57196 dated Feb. 12, 2016, pp. 1-12.
International Preliminary Report on Patentability for International Application No. PCT/US2015/057196 dated May 4, 2017, pp. 1-8.

* cited by examiner

NANOSHAPE PATTERNING TECHNIQUES THAT ALLOW HIGH-SPEED AND LOW-COST FABRICATION OF NANOSHAPE STRUCTURES

CROSS REFERENCE TO RELATED APPLICATIONS

This application is related to the following commonly owned U.S. patent application:

Provisional Application Ser. No. 62/067,496, "Precise Nanoscale Shape Controlled Large Area Patterning," filed Oct. 23, 2014, and claims the benefit of its earlier filing date under 35 U.S.C. § 119(e).

GOVERNMENT INTERESTS

This invention was made with government support under Grant No. EEC 1160494 and Grant No. ECCS1120823 awarded by the National Science Foundation. The U.S. government has certain rights in the invention.

TECHNICAL FIELD

The present invention relates generally to fabrication of nanostructures, and more particularly to nanoshape patterning techniques that allow high-speed and low-cost fabrication of nanoshape structures.

BACKGROUND

In a variety of nano-device applications, high-speed (low-cost) fabrication of nanostructures with sharp shapes is important. This includes devices exploiting nanoscale phenomena in optics, magnetics and biomedical materials. Specific device applications where these types of structures are needed are discussed below.

In the area of nanophotonics, the following exemplary shaped structures shown in FIGS. 1A and 1B are desirable. FIGS. 1A and 1B illustrate structures 101, 102, respectively, where the gaps g1 and g2 can be as small as 2 nm, and points A and B (see FIG. 1A) are sharp corners with a radius of curvature as small as 1 nm.

In the area of magnetics, multi-bit magnetic random access memory can be achieved using exemplary structures as shown in FIG. 2A, where d1 may be <10 nm in size. Similarly for thin-film heads used to read and write data onto hard disk drives, the following shaped structures as shown in FIG. 2B are desirable, where d2 may be <10 nm.

In the biomedical area, the ability to make shape controlled nanoparticles are known to be of interest in targeted diagnostics and drug delivery.

Currently, the highest resolution large area nanopatterning is used to make non-volatile CMOS based memory, specifically NAND flash with 17 nm half pitch and bit patterned media for high density magnetic storage in hard disks. While this patterning has historically been performed by photolithography, the resolution of the most advanced form of photolithography—193 nm immersion (193i) lithography—has plateaued at a resolution of approximately 40 nm halfpitch. Higher resolution patterns are fabricated by self-aligned double patterning (SADP), extreme ultraviolet lithography (EUVL), and multiple e-beam lithography (MEBL), but these techniques suffer from high costs, low throughput and are restricted to patterning periodic features.

Unfortunately, nanoimprinting techniques are currently limited to fabricating elementary nanoscale structures, such as dots, lines, etc. Current nanoimprinting techniques do not possess shape control to allow it to create nanoscale patterns with complex shapes which could be used in a variety of areas, such as magnetic memory, nanophotonic devices based on plasmonic and metamaterial structures and biomedical applications.

BRIEF SUMMARY

In one embodiment of the present invention, a method for template fabrication of ultra-precise nanoscale shapes comprises forming structures with a smooth shape on a substrate using lithography. The method further comprises subjecting the structures to an atomic layer deposition of one or more films leading to nanoscale sharp shapes with features that exceed lithography resolution capability of sub-10 nm resolution. The method additionally comprises performing a resist imprint of the nanoscale sharp shapes using imprint lithography. Furthermore, the method comprises etching the nanoscale sharp shapes into underlying functional films on the substrate forming a nanoshaped template with nanoscale sharp shapes that comprise one or more of the following: sharp corners and ultra-small gaps ranging from 1 to 10 nanometers.

In another embodiment of the present invention, a method for template replication of ultra-precise nanoscale shapes comprises using a master template for patterning of imprint material on a residual layer that is positioned on a dissolvable layer which is positioned on a substrate. The method further comprises depositing a dielectric layer over the imprint material and the residual layer to capture shape details. The method additionally comprises performing one of chemical vapor deposition, physical vapor deposition and atomic layer deposition of the deposited dielectric layer to create a film over the imprint material and the residual layer. Furthermore, the method comprises planarizing the film. Additionally, the method comprises bonding a replica substrate onto the planarized film. In addition, the method comprises eliminating the dissolvable layer followed by flipping over a structure comprising the imprint material, the residual layer and the substrate. Furthermore, the method comprises removing the imprint material thereby forming a replica template.

In a further embodiment of the present invention, a method for etching ultra-precise nanoscale shapes comprises depositing a dielectric layer over imprint material comprised of inorganic material and a residual layer that is positioned on a functional film layer which is positioned on a substrate. The method further comprises performing a planarization of the dielectric layer. The method additionally comprises etching back the planarized dielectric layer, wherein the imprint material is pre-compensated to account for system degradation of shape during the etching. Furthermore, the method comprises creating a negative pattern of the imprint material after removing the imprint material.

In another embodiment of the present invention, a method to fabricate shaped cross-section silicon nanowires comprises depositing a sacrificial polymeric layer on a silicon. The method further comprises imprinting on the sacrificial polymeric layer using a nanoscale shaped template. The method additionally comprises etching a polymeric residual layer resulting from the imprinting. Furthermore, the method comprises etching an underlying sacrificial polymeric layer following the etching of the polymeric residual layer, wherein the underlying sacrificial polymeric layer etch results in an undercut. Additionally, the method comprises performing a physical vapor deposition of a noble metal. In addition, the method comprises removing the sacrificial polymeric layer to create nanoshaped noble metal structures on the silicon. Furthermore, the method comprises performing a metal assisted chemical etching process to create nanowires.

In a further embodiment of the present invention, a method to fabricate shaped cross-section silicon nanowires comprises depositing a sacrificial polymeric layer on a silicon. The method further comprises imprinting on the sacrificial polymeric layer using a nanoscale shaped template. The method additionally comprises coating the sacrificial polymeric layer with a silicon organic coating. Furthermore, the method comprises planarizing and etching the silicon organic coating in a plasma involving fluorine and oxygen. Additionally, the method comprises etching an underlying sacrificial polymeric layer, wherein the underlying sacrificial polymeric layer etch results in an undercut. In addition, the method comprises performing a physical vapor deposition of a metal to promote adhesion. The method further comprises performing a physical vapor deposition of a noble metal. The method additionally comprises removing the sacrificial polymeric layer to create nanoshaped noble metal structures on the silicon. Furthermore, the method comprises performing a metal assisted chemical etching process to create nanowires.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

Figure 3:
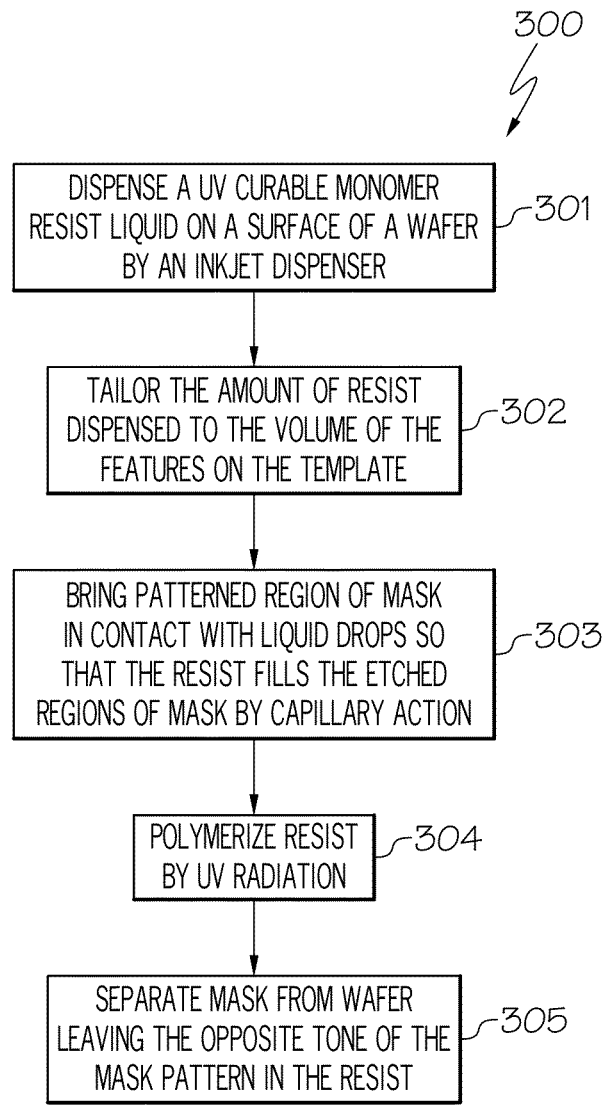
FIG. 3 is a flowchart of a method for using imprint lithography to pattern nanoscale shapes in accordance with an embodiment of the present invention.

The present invention focuses on using imprint lithography to pattern nanoscale shapes. An exemplary imprint lithography technique, known as Jet and Flash Imprint Lithography (J-FIL) is described next. A unique feature of J-FIL is that it uses a targeted resist dispense approach that allows adaptive material deposition to match pattern density variations in the mask that is to be replicated. This combined with low viscosity resist formulations leads to high throughput processes. A process for using imprint lithography to pattern nanoscale shapes is discussed below in connection with FIGS. 3 and 4A-4D. FIG. 3 is a flowchart of a method 300 for using imprint lithography to pattern nanoscale shapes in accordance with an embodiment of the present invention. FIG. 3 will be discussed in conjunction with FIGS. 4A-4D, which depict cross-sectional views of patterning nanoscale shapes using the steps described in FIG. 3 in accordance with an embodiment of the present invention.

Figure 4A:
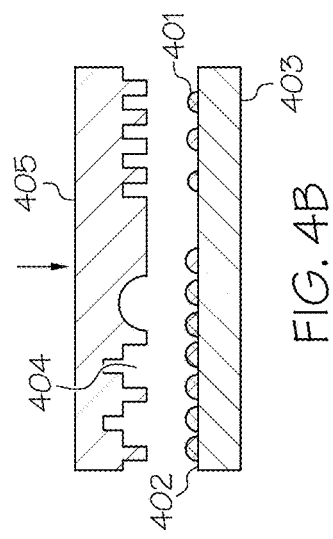
FIGS. 4A-4D depict cross-sectional views of patterning nanoscale shapes using the steps described in FIG. 3 in accordance with an embodiment of the present invention.

Referring to FIG. 3, in step 301, the UV curable monomer resist liquid 401 is dispensed on a surface 402 of the wafer 403 by an inkjet dispenser 404 as shown in FIG. 4A.

Figure 4B:
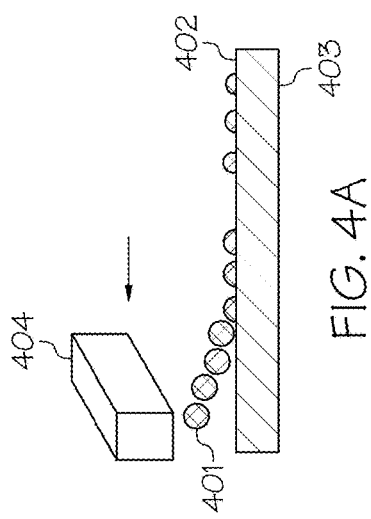

In step 302, the amount of resist dispensed is tailored according to the volume of the features 404 on the template 405 as shown in FIG. 4B.

Figure 4C:
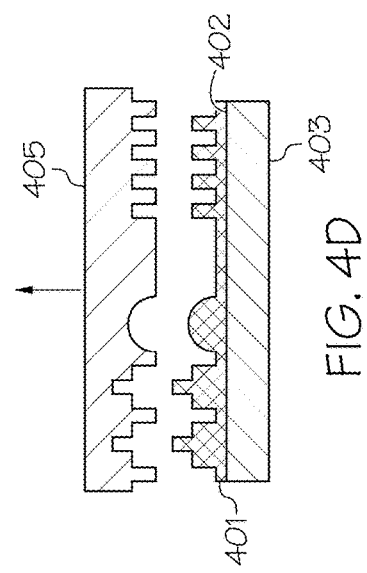

In step 303, the patterned region of the mask 405 called the field (see features 404) is brought in contact with the liquid drops 401 so that the resist fills the etched regions of the mask 405 by capillary action as shown in FIG. 4C. The largest monomer molecule in the resist used in this study is estimated to be about 1 nm by approximating a linear backbone.

In step 304, the resist is then polymerized by UV radiation 406 by a blanket cure step as shown in FIG. 4C.

Figure 4D:
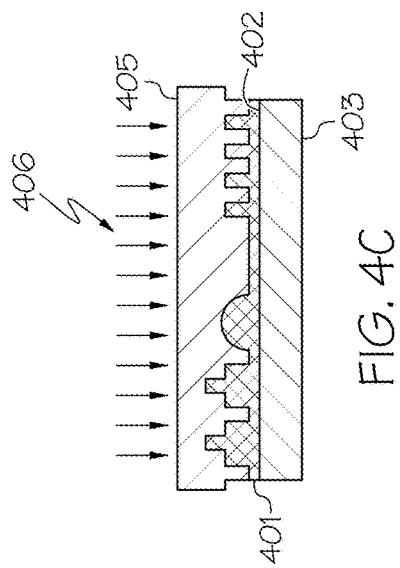

In step 305, the mask 405 is separated from the wafer leaving the opposite tone of the mask pattern in the resist 401 as shown in FIG. 4D.

Imprinting time of less than 2 s is made possible by dispensing a grid containing thousands of drops with drop volumes of 6 picoliters or less and advanced drop layout optimization. J-FIL has demonstrated 24 nm patterning with <2 nm line edge roughness and 1.2 nm critical dimension uniformity. Due to its molecular level resolution, it is a viable candidate for manufacturing high precision devices requiring unconventional nanoshape geometries.

The principles of the present invention address novel template fabrication techniques, integration of materials to enable in-situ metrology of template and patterning materials, and novel methods for retention of desired shape through patterning and pattern transfer processes.

Figure 5:
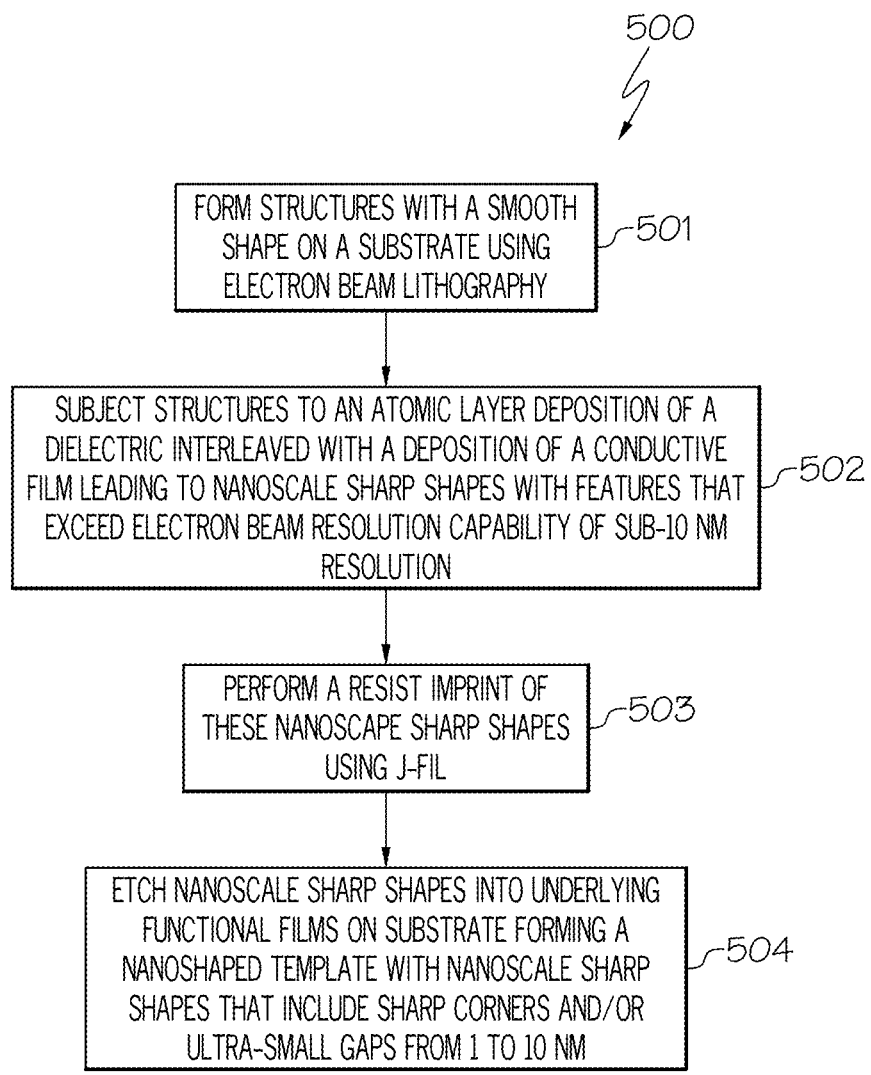
FIG. 5 is a flowchart of a method for fabricating a template in accordance with an embodiment of the present invention.

Shape controlled template fabrication has been previously discussed with respect to polygonal shape. The present invention discloses the concept of creating sharp nanoshapes by starting from smooth shapes, such as circular or elliptical cross-section pillars, and using precise conformal deposition using techniques, such as chemical vapor deposition (CVD) or atomic layer deposition (ALD). FIG. 5 is a flowchart of a method 500 for fabricating a template in accordance with an embodiment of the present invention. FIG. 5 will be discussed in conjunction with FIGS. 6A-6D, which depict cross-sectional views of fabricating a template using the steps described in FIG. 5 in accordance with an embodiment of the present invention.

Figure 6A:
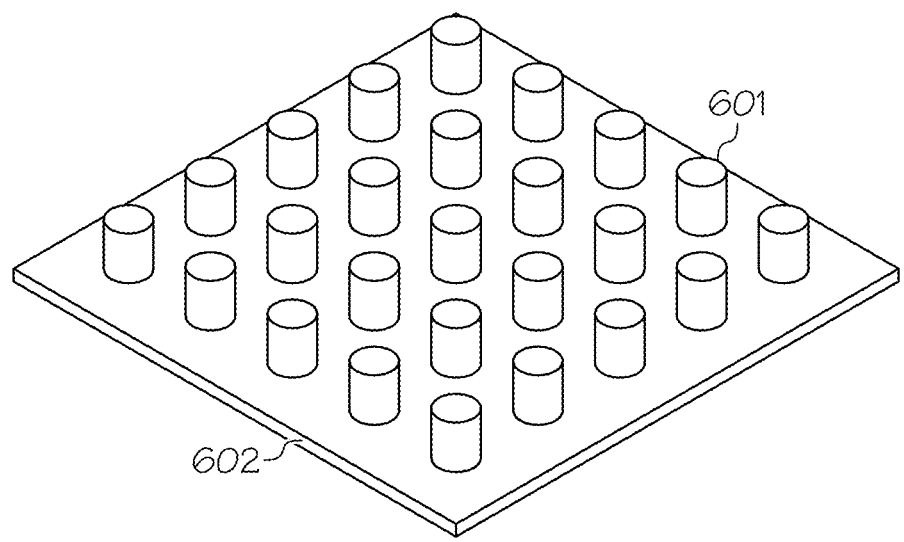
FIGS. 6A-6D depict cross-sectional views of fabricating a template using the steps described in FIG. 5 in accordance with an embodiment of the present invention.

Referring to FIG. 5, in step 501, structures 601 with a smooth shape (e.g., circular or elliptical cross-section pillars) are formed on a substrate 602 (e.g., fused silica substrate) using electron beam lithography as shown in FIG. 6A.

Figure 6B:
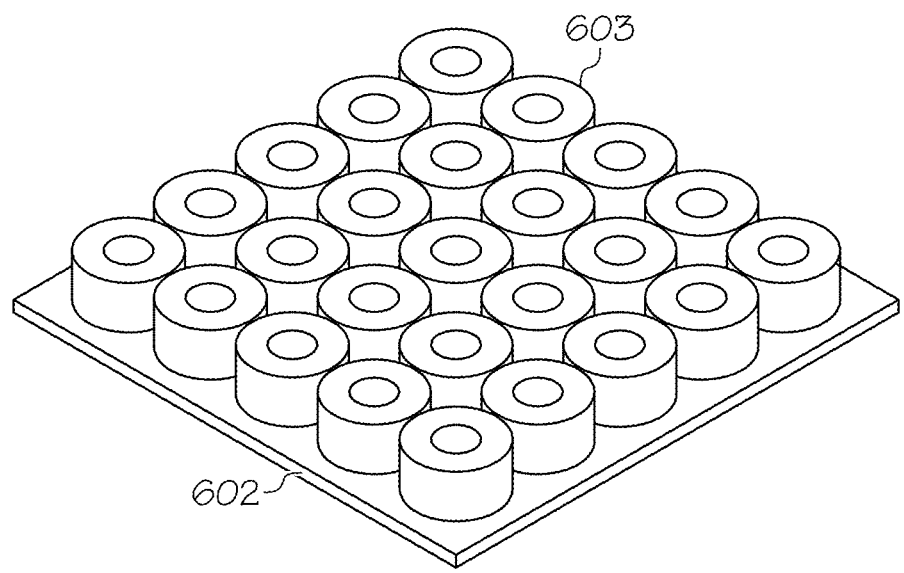

In step 502, structures 601 are subject to atomic layer deposition (ALD) of a dielectric (e.g., silicon dioxide) interviewed with a deposition of a conductive film (e.g., TiN) leading to nanoscale sharp shapes 603 (e.g., diamond-like shapes) with features that exceed electron beam resolution capability of sub-10 nm resolution as shown in FIG. 6B.

Figure 6C:
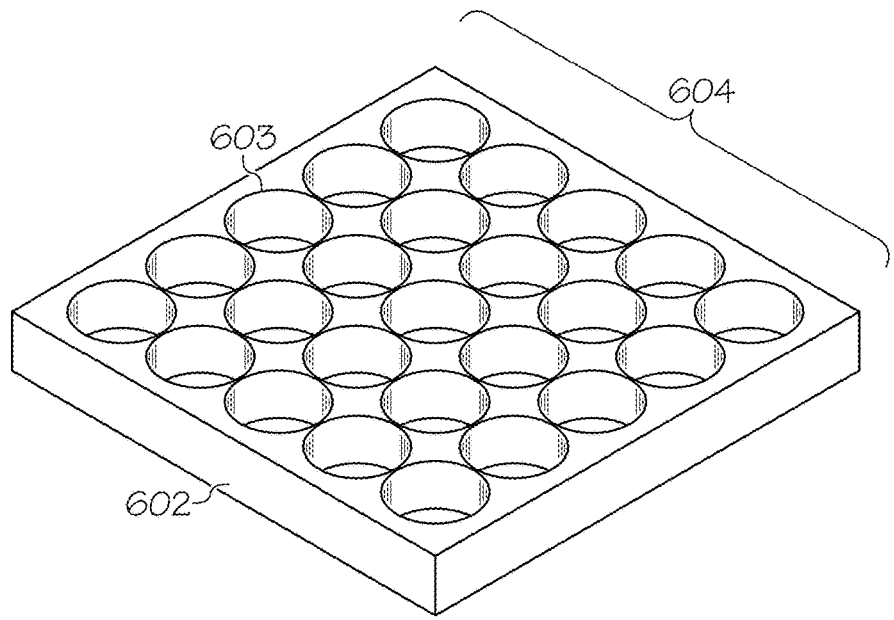
Figure 6D:
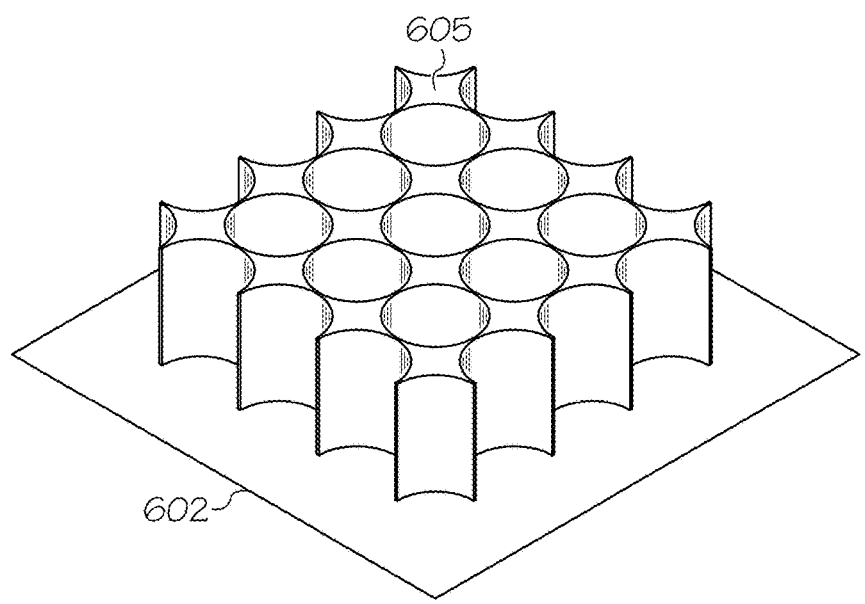

In step 503, a resist imprint 604 of these nanoscale sharp shapes 603 using J-FIL is performed as shown in FIG. 6C.

Figure 7:
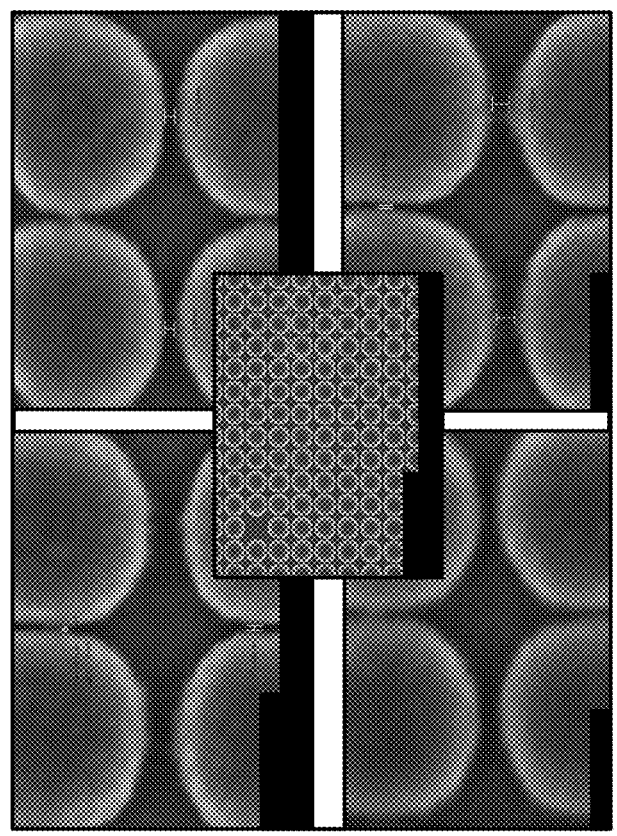
FIG. 7 is scanning electron microscope (SEM) micrographs of the resulting nanoshaped template using the method of FIG. 5 in accordance with an embodiment of the present invention.

In step 504, nanoscale sharp shapes 603 are etched into underlying functional films (e.g., thermal oxide) on silicon wafer 602 forming a nanoshaped template 605 with nanoscale sharp shapes that include sharp corners and/or ultra-small gaps ranging from 1 to 10 nm. In one embodiment, nanoshaped template 605 is pre-compensated (such as using a nanoscale bridge that connects adjacent nanoscale sharp shapes) to account for system degradation of the shape during the etching step as discussed further below. In one embodiment, such a nanoshaped template 605 with nanoscale sharp shapes may be utilized in various applications, such as magnetic memory, nanophotonic devices and biomedical applications. SEM micrographs of the resulting nanoshaped template 605 are shown in FIG. 7 in accordance with an embodiment of the present invention.

FIGS. 5 and 6A-6D illustrate the process flow for creating templates with diamond-like shapes that include sharp corners starting from circular cross-section pillars. The data included in FIGS. 5 and 6A-6D was obtained using ALD of $SiO_2$ interleaved with ALD of TiN. TiN films are reasonably conductive and reasonably transparent to UV light at about 20 nm (UV transparency is needed for crosslinking exposure in J-FIL). $SiO_2$ is desired as the final film as imprint process materials typically are compatible with $SiO_2$. A nanoshaped template created in this manner with embedded TiN can be inspected under an SEM without charging effects as TiN is conducting. This approach can be used to create templates with very precise nanoscale control.

Figure 1A:
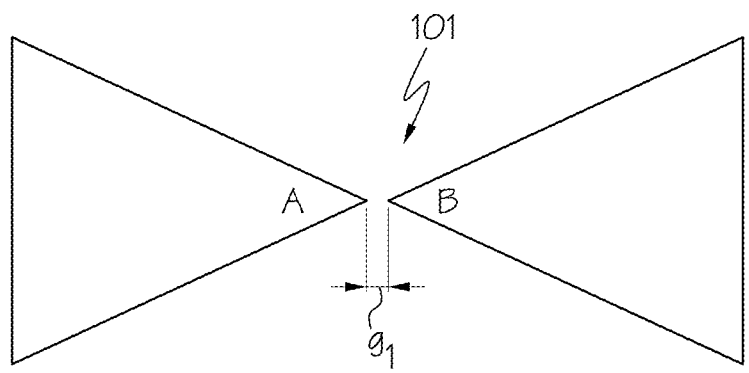
FIGS. 1A and 1B illustrates desirable shaped structures in the area of nanophotonics.
Figure 1B:
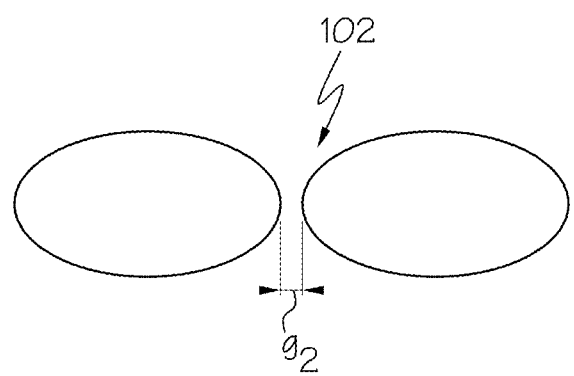
Figure 2A:
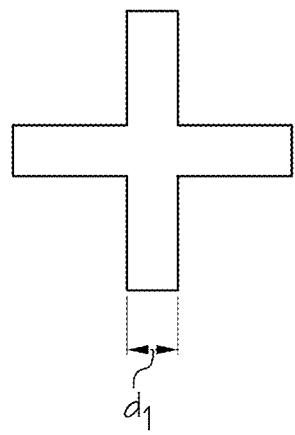
FIG. 2A illustrates an exemplary structure in the area of magnetics to achieve multi-bit magnetic random access memory.
Figure 2B:
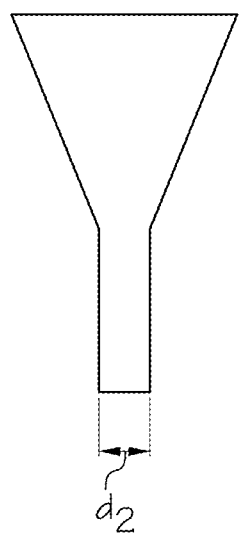
FIG. 2B illustrates desirable shaped structures for thin-film heads used to read and write data onto hard disk drives.

SEM inspection can be carried out in-situ and additional deposition can be carried out to create and refine a template that has the desired nanoshape geometry. In a situation where a very small feature is required (such as the ones in FIGS. 1A and 1B), or where the size of features has to be adjusted without compromising sharp shapes (FIGS. 2A and 2B), this approach of nanoscale deposition with in-situ metrology capability can be very useful. It is important to ensure in these situations that the starting features are precise in their size, shape and location. For example, the pillar features in FIGS. 6A-6D need to have a diameter control, and placement control of sub-3 nm. Also, the pillar wall angle should be substantially vertical (as close to 90° as possible). Very precise size and placement control can be possible using combinations of electron beam wherein the feature pitch is precisely controlled along with techniques, such as block copolymer (BCP) directed self-assembly (DSA). BCP can provide precise size control and DSA can ensure precise location control relative to the electron beam grid. Side wall angle control can be improved by embedding an etch stop underneath the patterning material during the creation of the pattern prior to deposition, such as ALD. For example, the $SiO_2$ pillars shown in FIGS. 6A-6D can be created on top of a SiN layer that can be used as an etch stop during the $SiO_2$ anisotropic reactive ion etch (RIE) to create the pillars. Such as etch stop allows for a modest over-etch in the anisotropic RIE step to ensure that the wall angles are substantially vertical.

Figure 8C:
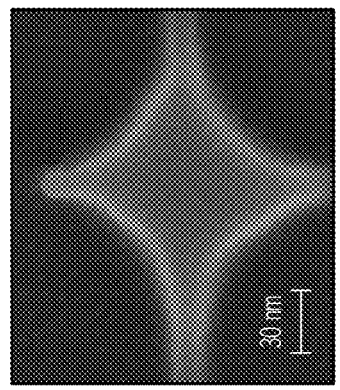
FIG. 8C is an SEM image of the etched diamond showing 5.2 nm radius corners in the oxide in accordance with an embodiment of the present invention.
Figure 8F:
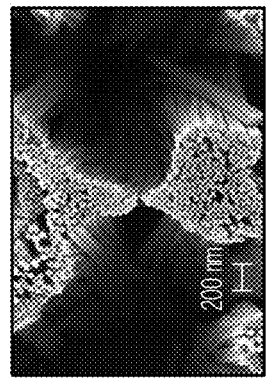
FIG. 8F is an SEM image of the circular silicon nanowires in accordance with an embodiment of the present invention.
Figure 8B:
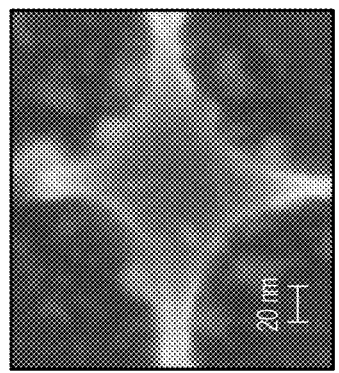
FIG. 8B is an SEM image of the imprint resist before the residual layer etch in accordance with an embodiment of the present invention.
Figure 8E:
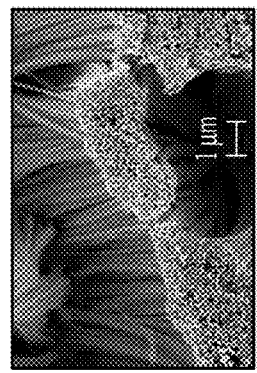
FIG. 8E is an SEM image of the high aspect ratio shaped silicon nanowires in accordance with an embodiment of the present invention.
Figure 8A:
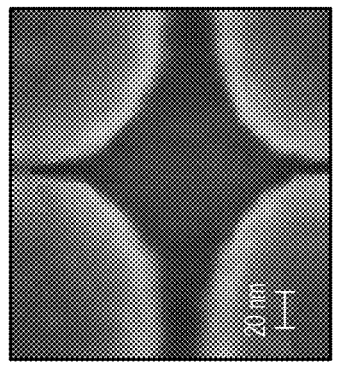
FIG. 8A is an SEM image of the template showing a 2.6 nm radius corner in accordance with an embodiment of the present invention.
Figure 8D:
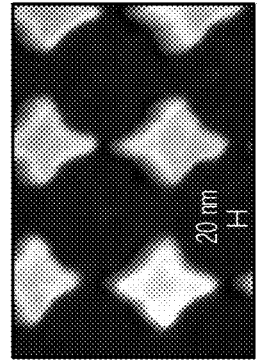
FIG. 8D is an SEM image of the diamond shaped nanowire cross-section in accordance with an embodiment of the present invention.

Finally, the diamond template is used to form shaped nanowires with sharp corners to produce large arrays of diamond-shaped nanowires, which can be used as enhanced capacitors. (Here the diamond shape has been used as an exemplary shape to form nanoshaped cross-section nanowires. Other nanoscale shapes can also be used to make similar nanowires, such as cross-sectional shapes disclosed in U.S. Pat. No. 8,828,297, which is hereby incorporated by reference in its entirety.) Here the template in FIGS. 6A-6D is used to form a diamond pattern with gold followed by a metal assisted chemical etching (MACE) process (discussed below) used to create the shaped silicon nanowires. Images of the diamond nanowires are shown in FIGS. 8A-F. FIG. 8A is an SEM image of the template showing a 2.6 nm radius corner in accordance with an embodiment of the present invention. FIG. 8B is an SEM image of the imprint resist before the residual layer etch in accordance with an embodiment of the present invention. FIG. 8C is an SEM image of the etched diamond showing 5.2 nm radius corners in the oxide in accordance with an embodiment of the present invention. FIG. 8D is an SEM image of the diamond shaped nanowire cross-section in accordance with an embodiment of the present invention. FIG. 8E is an SEM image of the high aspect ratio shaped silicon nanowires in accordance with an embodiment of the present invention. FIG. 8F is an SEM image of the circular silicon nanowires in accordance with an embodiment of the present invention.

Figure 9A:
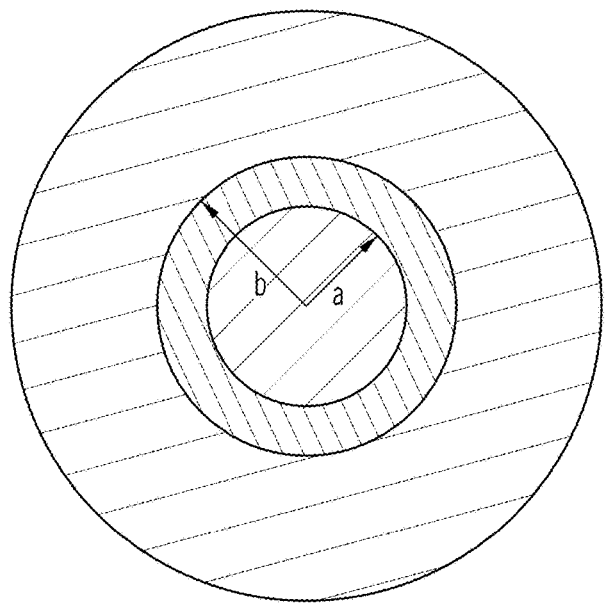
FIG. 9A illustrates a circular cross section capacitor in accordance with an embodiment of the present invention.
Figure 9B:
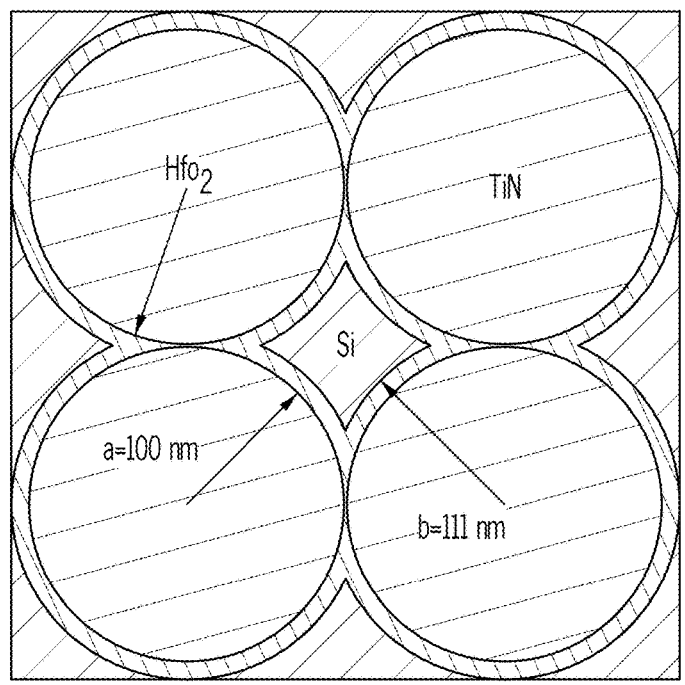
FIG. 9B illustrates a diamond cross section capacitor model in accordance with an embodiment of the present invention.

Furthermore, capacitors were fabricated using these diamond-shaped nanowires (discussed below). The diamond-shaped nanowires have significantly improved capacitance compared to circular Si nanowire capacitors Equation (1) (shown further below) gives the capacitance of a cylindrical capacitor which is a function of its height (h) and the inner (a) and outer (b) radii of the dielectric ring as shown in FIGS. 9A-9B. FIG. 9A illustrates a circular cross section capacitor 900, where a is the radius of the inner electrode 901 and b is the radius of the outer electrode 902 in accordance with an embodiment of the present invention. FIG. 9B illustrates a diamond cross section capacitor model 903 with equivalent a and b in accordance with an embodiment of the present invention.

The equation accounts for the difference in surface area due to the dielectric thickness. For the capacitors with circular cross section, a is 50 nm, and b is 61 nm. In one embodiment, the dielectric constant used in the analytical calculations was back calculated using the parallel plate capacitor equation and data from a capacitor with known thicknesses. This was done because the method of deposition can influence the actual dielectric constant value compared to theoretical values. In the case of the diamond cross section shown in FIG. 8B, the calculations were performed using the titanium nitride electrodes which are assumed to be pillars with circular cross sections of 100 nm radius. The projected increase in capacitance for a diamond cross section compared to the circular cross section for the same projected area and pillar height was calculated to be ~76%.

$$C_{cylinder} = \frac{2\pi\varepsilon_0\varepsilon_S h}{\ln(b/a)} \quad (1)$$

The capacitance of the nanowires is 18.44 $nF/cm^2/nm$ compared to 9.67 $nF/cm^2/nm$ for circular nano-wire capacitors which is a 90.62% increase in capacitance per projected area per unit pillar height as shown in Table 1. The experimental capacitance values were slightly less than the expected analytic values which are believed to be due to some critical dimension loss compared to the ideal geometries during pattern transfer. The nanowire capacitor data has been normalized not only for a unit square area but also for a unit height of the nanowires to allow effective comparison with other similar work reported in literature. The resulting shaped nanowire capacitors not only exceeded the circular nanowire capacitor, but also porous nanocapacitors previously reported where they achieved ~10 $nF/cm^2/nm$. Further, the approach of the present invention should be scalable to 10× smaller half-pitch nanowires since nanoimprint has demonstrated structures as small as 10 nm half-pitch over large areas; this would increase surface area and therefore potential capacitance by an addition ~10×.

TABLE 1

Capacitance per Projected Area per Pillar Height.
Capacitance per Projected Area per unit Pillar Height
($nF/cm^2/nm$)

|  | Circular Nanowire Capacitor | Shaped Nanowire Capacitor | Percent Capacitance Increase of Shaped Nanowire Capacitor |
|---|---|---|---|
| Analytical | 12.62 | 22.24 | 76.20% |
| Experimental | 9.67 | 18.44 | 90.62% |

Various experimental methods have been employed, such as MACE, Si-Nanowire (NW) fabrication, Si-NW capacitor fabrication and SEM preparing and imaging discussed below.

MACE

Metal Assisted Chemical Etching (MACE) is a wet etch process where silicon is preferentially etched at the interface between a noble metal and the silicon surface in a solution of hydrofluoric acid (HF), deionized (DI) water, and an oxidant (commonly $H_2O_2$). This results in an anisotropic etch where the geometry of the features is determined by the shape of the patterned noble metal as well as the metal's mechanical stability during the etch. The preferential etch mechanism is as follows: (i) the noble metal catalyzes the reduction of the oxidant creating holes, (ii) the holes are injected through the metal into the silicon where it contacts the metal, (iii) the silicon oxidizes, (iv) the HF dissolves the oxidized silicon, and (v) finally, the soluble products are removed and the metal moves into the space where the process repeats.

Si-NW Fabrication

Silicon nanowires are fabricated using the MACE process when the metal catalyst is a continuous thin film with an array of openings. Gold meshes with diamond holes and circular holes were fabricated using a bi-layer lift-off process. First, the diamond shaped or circular shaped pillars are imprinted on a 100 nm layer of polyvinyl alcohol (PVA). The circular pillars have a diameter of 100 nm and a pitch of 200 nm and the diamond pillars are imprinted using the template made by the ALD process. After the RLT is removed, a slightly isotropic dry etch is used to created overhangs to help with the lift-off Gold is then deposited on the sample using an e-beam evaporator and finally, lift-off is performed in water with ultra-sonication.

Si-NW Capacitor Fabrication

ALD was used to deposit 11 nm of hafnium oxide and 50 nm of titanium nitride on nano-pillar arrays to fabricate metal-insulator-silicon nano-capacitors. Aluminum was sputtered onto the backside of the wafer to create better contact for the measurements. The sample was divided into 300 µm by 300 µm capacitors by using photolithography to define contact pads for capacitance measurements.

SEM Preparation and Imaging

Samples were coated with ruthenium tetroxide by chemical vapor deposition to artificially induce contrast. Ruthenium tetroxide selectively reacts with the polymer acrylate groups allowing for enhanced visualization of structural detail. A 0.5% aqueous solution of ruthenium tetroxide was placed in a sealed container for two hours with the SEM samples. All SEM images were taken below 2 kV with maximum working distance of 3 mm. The diamond template was made up of a set of 9 diamond grids. A gridding system was used to track particular diamonds through each step of the fabrication process. An image processing analysis software was employed to analyze the resulting SEM images. The SEM images were converted into a binary format for analysis and edge detection was used to define the contour lines.

Figure 10:
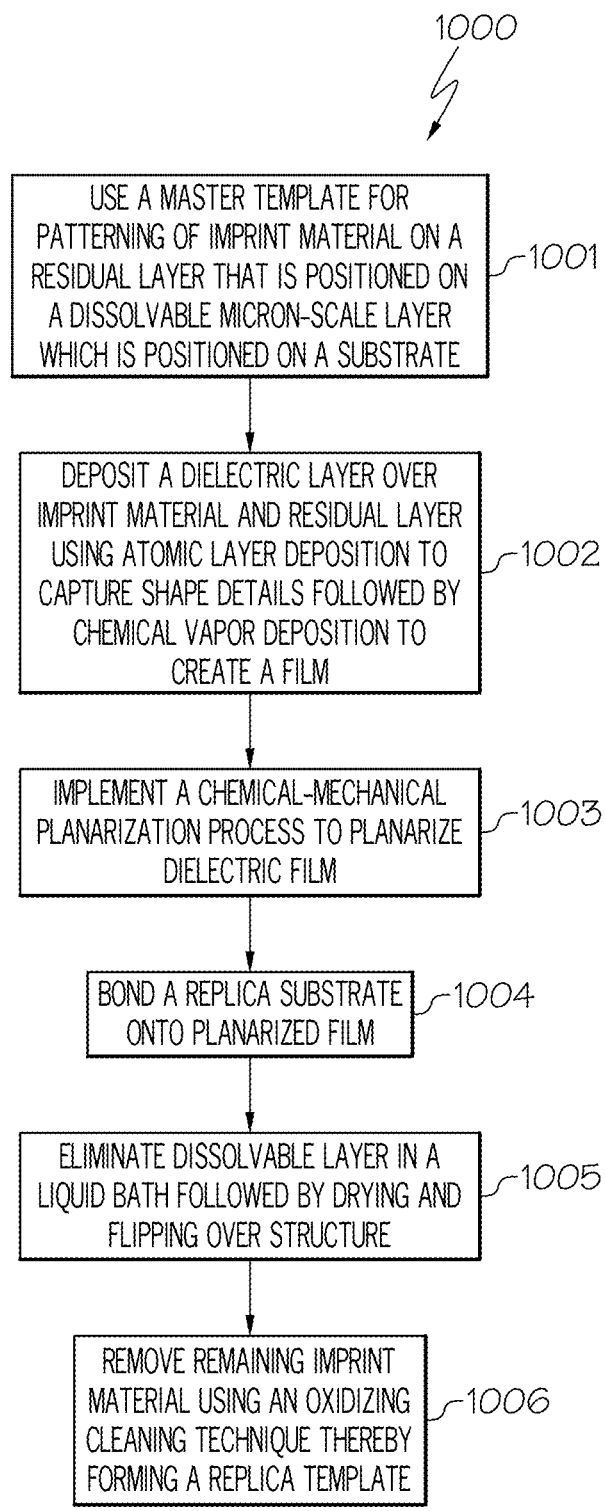
FIG. 10 is a flowchart of a method for retaining the detailed shapes of an imprinted feature while creating a replica without the use of a reactive ion etch (RIE) process in accordance with an embodiment of the present invention.

Another aspect of imprint lithography is the ability of the process to create replicas of templates—one master template can be used to create a large number of daughters or replicas which can then be used in volume manufacturing. It is important though to ensure that if precise nanoshapes are included in the master, they can be retained while creating the replica. An etch-free approach to create replicas is described below as anisotropic RIE processes can cause damage to sharp shapes, a topic that is discussed later herein. FIG. 10 is a flowchart of a method 1000 for retaining the detailed shapes of an imprinted feature while creating a replica without use of a reactive ion etch (RIE) process in accordance with an embodiment of the present invention. FIG. 10 will be discussed in conjunction with FIGS. 11A-11F which depict cross-sectional views of fabricating a replica template using the steps described in FIG. 10 in accordance with an embodiment of the present invention.

Figure 11A:
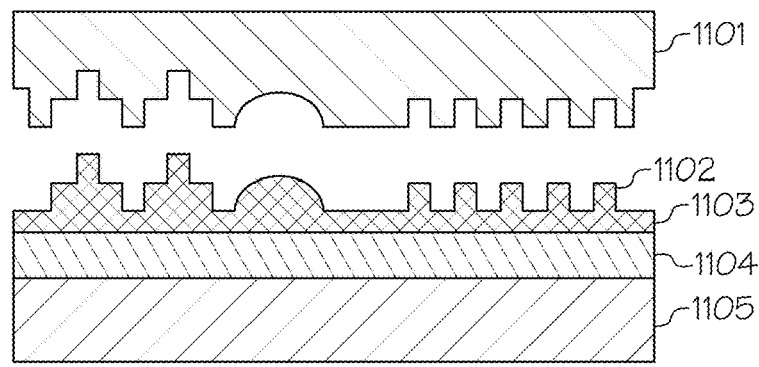
FIGS. 11A-11F depict cross-sectional views of fabricating a replica template using the steps described in FIG. 10 in accordance with an embodiment of the present invention.

Referring to FIG. 10, in step 1001, a master template 1101 is used for patterning of imprint material 1102 on a residual layer 1103 that is positioned on a dissolvable micron-scale layer 1104 which is positioned on a substrate 1105 as shown in FIG. 11A.

Figure 11B:
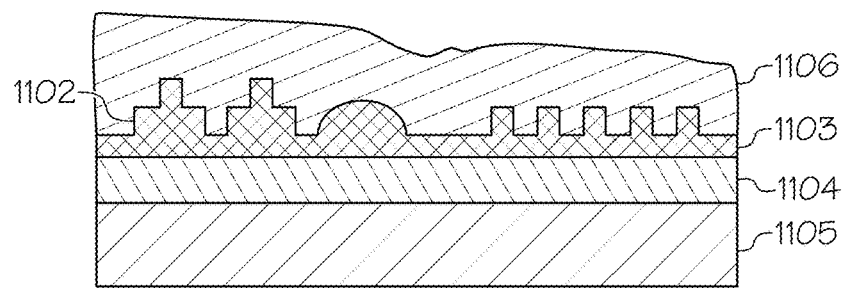

In step 1002, a dielectric layer (e.g., $SiO_2$ or SiN) is deposited over imprint material 1102 and residual layer 1103 using atomic layer deposition to capture shape details followed by chemical vapor deposition to create a film 1106 over imprint material 1102 and residual layer 1103 shown in FIG. 11B.

Figure 11C:
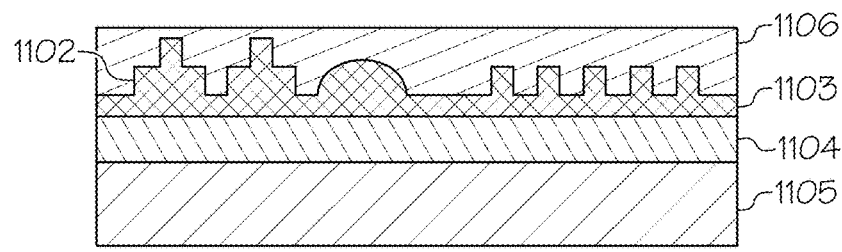

In step 1003, a chemical-mechanical planarization process is implemented to planarize dielectric film 1106 as shown in FIG. 11C.

Figure 11D:
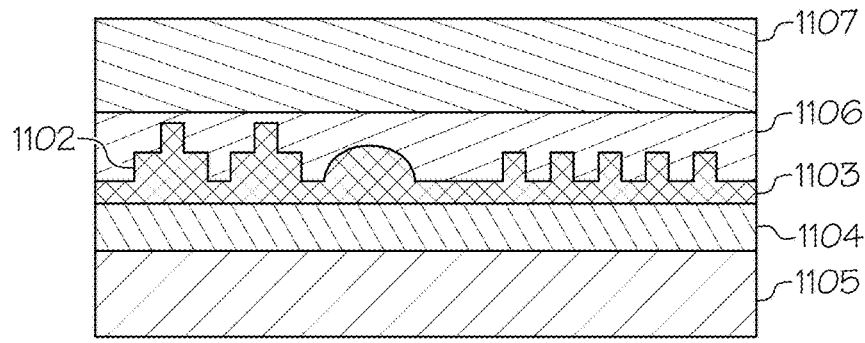

In step 1004, a replica substrate (e.g., glass) 1107 is bonded onto planarized film 1106, where the bonding can be anodic or using an adhesive that covalently bonds with planarized film 1106 and replica substrate 1107 as shown in FIG. 11D.

Figure 11E:
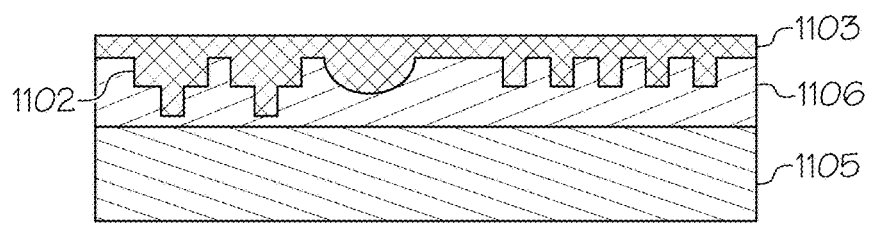

In step 1005, dissolvable layer 1104 is eliminated in a liquid bath followed by drying and flipping over the structure as shown in FIG. 11E.

Figure 11F:
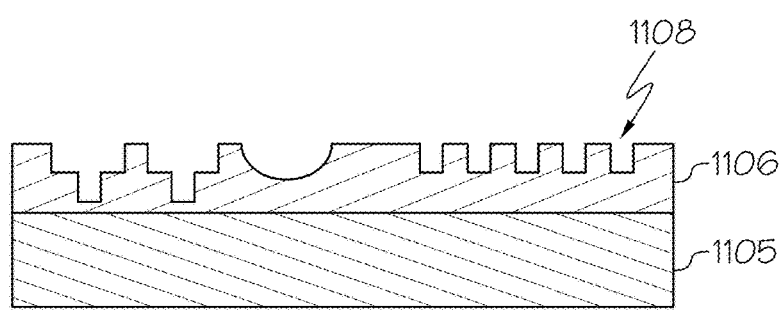

In step 1006, the remaining imprint material 1102 is removed using an oxidizing cleaning technique, such as an oxygen plasma ash, thereby forming a replica template 1108 as shown in FIG. 11F.

Referring to FIGS. 10 and 11A-11F, the master and replica template substrates 1101, 1108, respectively, may be made from glass (fused silica, quartz, etc.). In one embodiment, imprint material 1102 may be a commercially material, such as the MonoMat series of materials offered by Molecular Imprints, Inc. Dissolvable layer 1104 may be a material, such as PVA (dissolves in water at ~80° C.) or a positive photoresist. One common positive photoresist used with the I-line exposure from a mercury-vapor lamp is based on a mixture of diazonaphthoquinone (DNQ) and novolac resin (a phenol formaldehyde resin). DNQ inhibits the dissolution of the novolac resin, but upon exposure to I-line, the dissolution rate increases dramatically. DNQ-novolac resists can then be dissolved in a basic solution (usually 0.26N tetramethylammonium hydroxide (TMAH) in water). The dissolvable layer may be optionally coated using a TranSpin or ValMat materials (commercially developed by Molecular Imprints, Inc.) to enhance compatibility with imprint material 1102. The thickness of dissolvable layer 1104 is chosen to be on the micron scale (1-20 microns) to enable fast liquid phase separation of the sandwich shown in FIG. 11D. In FIG. 11B, imprint material 1102 may be optionally treated with a brief exposure to $O_2$ plasma to create chemical reaction sites on the imprinted polymer to enhance atomic layer deposition (ALD) on the polymer without affecting the shape control of imprinted features 1102. The ALD may be followed by a chemical vapor deposition (CVD) process to create the film in FIG. 11B, the ALD being primarily important for precise shape retention and CVD allowing for faster deposition of the dielectric. In some cases, only CVD or only ALD might be used. The dielectric deposition might be interleaved with the deposition of a conducting material, such as AN to facilitate in-situ SEM characterization as discussed earlier. In one embodiment, the ALD/CVD is carried out at temperatures below about 150° C. to ensure that the imprinted polymer does not undergo any shape deformation. In summary, the process steps of method 1000 provide a process for replicating nanoshape templates while substantially retaining pattern precision.

Another aspect of the present invention is the ability to perform in-situ metrology of the imprinted resist to check and qualify the shape of the pattern after imprint, and to correlate the imprinted shape to the master template shape. During SEM imaging, prolonged exposure to the electron beam can deform the polymer making precise shape measurements extremely difficult to attain. To overcome these challenges, a chemical staining approach was invented. A chemical vapor deposition of ruthenium tetroxide was performed to coat the nanopatterns with a thin conductive layer. To further alleviate electron beam effects, the SEM images (shown in FIGS. 12A-12C) were taken at low keV. The staining method of the present invention may be very important for in-situ metrology prior to template replication to ensure that the replica possesses the desired nanoscale control and prior to developing etch processes as discussed below.

It has been discovered that etching of nanoshape features into functional films using imprinted polymers has some challenges. The etch process for imprint lithography requires two steps, the first step is a non-selective etch of the residual layer of the polymer created in the imprint step (see method 1000 of FIG. 10). This step is a pure physical etch and has a tendency to erode sharp and nanoscale structures. The second step involves a more selective etch between the imprint resist and the underlying film and is therefore somewhat less damaging of nanoscale precision in features. There are two ideas disclosed in the present invention.

The first idea is to pre-compensate the template feature to create a structure which when exposed to anisotropic RIE will lead to a final structure that is the desired structure. This approach is likely suited for both steps of etch discussed above (non-selective and selective steps), but is particularly beneficial for the non-selective residual layer etch step. The idea is demonstrated by the experimental results discussed below where a diamond-like shape is fabricated with very sharp nano-corners as shown in FIGS. 12A-12C.

Figure 12A:
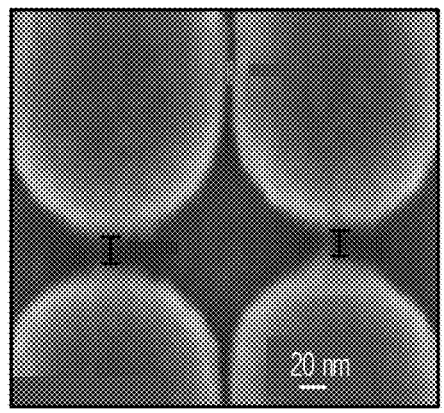
FIG. 12A is a scanning electron microscope (SEM) image of a pre-compensated template in accordance with an embodiment of the present invention.

FIG. 12A is a scanning electron microscope (SEM) image of a pre-compensated template in accordance with an embodiment of the present invention. FIG. 12B is an SEM image of the imprinted feature with a nanoscale bridge in accordance with an embodiment of the present invention. FIG. 12C is an SEM image of the post-etch pattern with separated diamond-like shapes in accordance with an embodiment of the present invention.

Figure 12B:
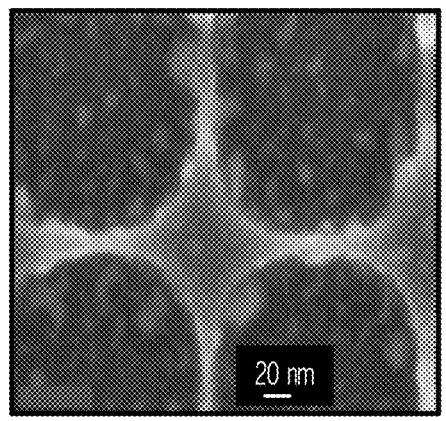
FIG. 12B is an SEM image of the imprinted feature with a nanoscale bridge in accordance with an embodiment of the present invention.
Figure 12C:
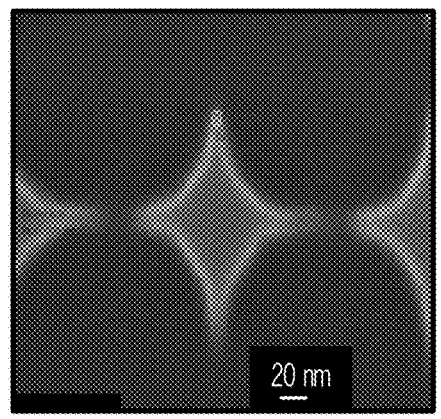
FIG. 12C is an SEM image of the post-etch pattern with separated diamond-like shapes in accordance with an embodiment of the present invention.

Referring to FIGS. 12A-12C, a pre-compensated template (FIG. 12A) creates the imprinted pattern in FIG. 12B which includes a "nanoscale bridge" that connects adjacent diamond-like shapes. After etching (as shown in FIG. 12C), the bridge is lost leading to the desired separated nano-shaped diamonds.

The second idea is discussed in connection with FIGS. 13 and 14A-14D. It involves the creation of a negative replica of the imprinted pattern in a dense inorganic material, such as $SiO_2$ or SiN, so that the subsequent etching of the pattern into the functional film is performed using an etch mask that is significantly more robust in RIE processes as compared to imprinted polymers that have polymer chains on the order of the sharp shapes that are being transferred. The process can be implemented after the non-selective residual layer etch (as discussed in method 1300 of FIG. 13) or prior to such a non-selective etch. In the latter case, a selective etch of the residual layer will be required after the inorganic negative pattern has been created. The "etch back" step in FIG. 13 could involve a blanket uniform etch process using a halogen chemistry for materials, such as $SiO_2$. The approach of method 1300 of FIG. 13 can be combined with the first idea (pre-compensation) to further account for any parasitics that may result from the residual layer etch or etch into the functional film.

Figure 13:
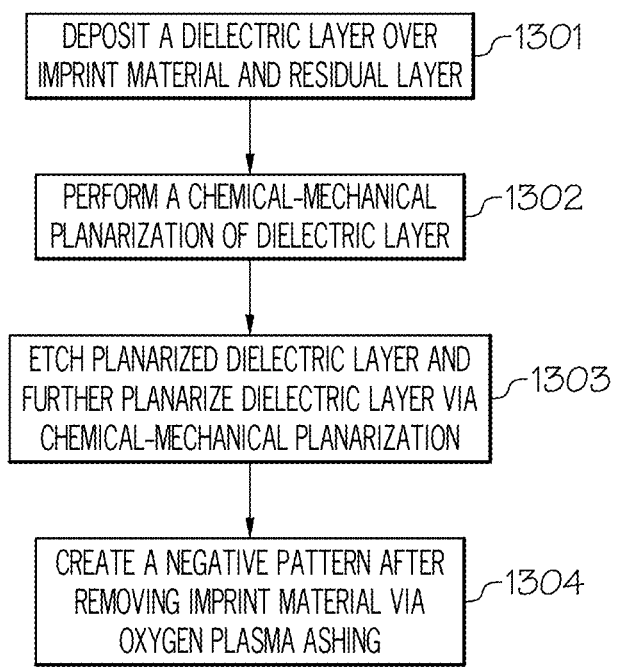
FIG. 13 is a flowchart of method for creating a negative replica of the imprinted image in a dielectric in accordance with an embodiment of the present invention.

FIG. 13 is a flowchart of method 1300 for creating a negative replica of the imprinted image in a dielectric in accordance with an embodiment of the present invention. FIG. 13 will be discussed below in conjunction with FIGS. 14A-14D which depict cross-sectional views of creating a negative replica of the imprinted image in a dielectric using the steps described in FIG. 13 in accordance with an embodiment of the present invention.

Figure 14A:
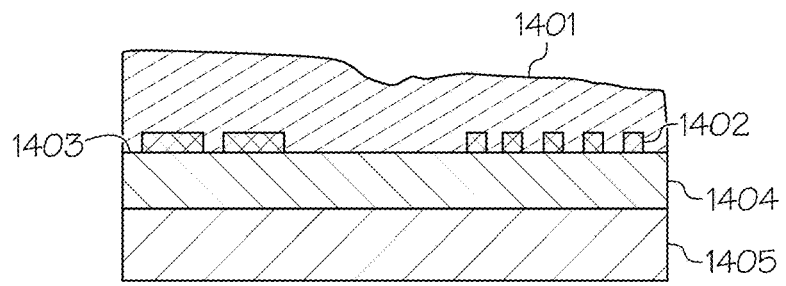
FIGS. 14A-14D depict cross-sectional views of creating a negative replica of the imprinted image in a dielectric using the steps described in FIG. 13 in accordance with an embodiment of the present invention.

Referring to FIG. 13, in step 1301, a dielectric layer 1401 is deposited via atomic layer deposition and chemical vapor deposition over imprint material 1402 and residual layer 1403 as illustrated in FIG. 14A. As further illustrated in FIG. 14A, residual layer 1403 is positioned above a layer of functional film 1404 which is positioned above a substrate 1405. In one embodiment, imprint material 1402 is comprised of dense inorganic material (e.g., $SiO_2$ or SiN).

Figure 14B:
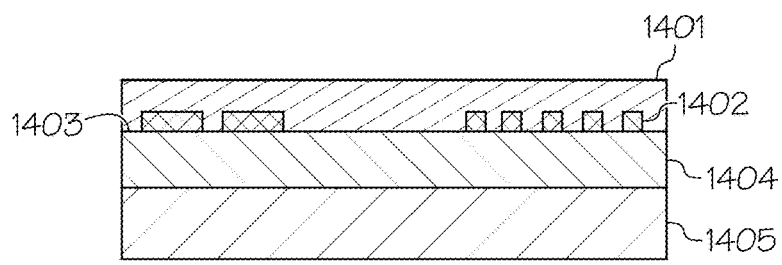

In step 1302, a chemical-mechanical planarization of dielectric layer 1401 is performed as shown in FIG. 14B.

Figure 14C:
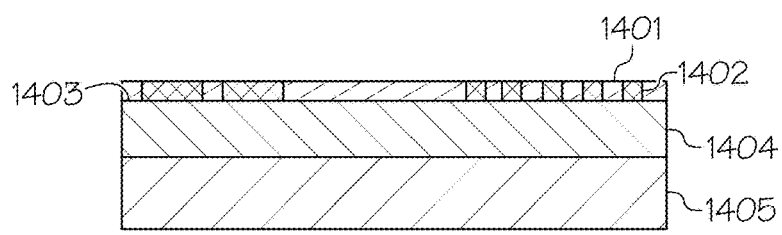

In step 1303, the planarized dielectric layer 1401 is etched back as shown in FIG. 14C. In one embodiment, imprint material 1402 is pre-compensated (as discussed above) to account for system degradation of shape during the etching step. In one embodiment, the planarized dielectric layer 1401 is further planarized via chemical-mechanical planarization after etching back the planarized dielectric layer 1401.

Figure 14D:
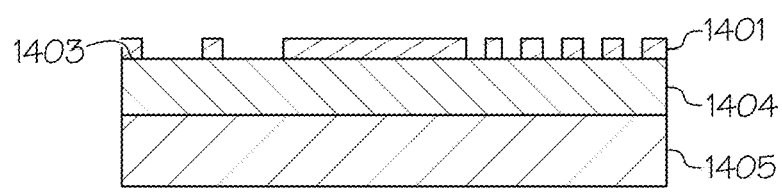

In step 1304, a negative pattern is created after removing imprint material 1402 via oxygen plasma ashing as shown in FIG. 14D.

In this manner, the resulting negative replica is composed of a much tighter packed inorganic material as compared to the imprinted polymer. The imprinted polymer is expected to have poorer pattern retention when exposed to RIE gases and anisotropic physical etching in particular, as compared to these inorganic materials. Therefore, these inorganic materials can be used for subsequent pattern transfer into the underlying functional films without substantial loss of nanoscale pattern fidelity.

Another aspect of the present invention is to use the template with precise nanoscale features to pattern an underlying film of imprint resist, which is then used to create a complementary pattern in a noble metal, such as gold, silver, palladium, platinum, rhodium or other metals, such as copper. In one embodiment, the precise nanoscale features are patterned using Jet and Flash Imprint Lithography (J-FIL™) as it enables patterning of sub-10 nm high density features with versatile geometries over large areas. Other forms of imprint lithography can also be used in this context, such as thermally molded polymer nanoimprint lithography or UV cured spin-on resist based nanoimprint lithography, all with molecular-scale resolution. After defining the resist pattern, a lift-off process is used to transfer the post-JFIL resist pattern into a thin metal (e.g., gold) layer that defines a robust "mesh" for Metal-Assisted Chemical Etching (MACE), which is a solution based anisotropic etch technique that utilizes a noble metal, such as gold, to catalyze the chemical reaction in the solution to significantly increase the silicon etch rate at the silicon-metal interface. The difference in etch rate between the bare silicon and the silicon covered with a patterned metal layer means that the high aspect ratio features that retain the shape of the patterned metal can be fabricated. This gold mesh is then used in the MACE process to create silicon nanowires with diamond-shaped cross sections and high aspect ratios (with values exceeding 140 demonstrated). Imprint lithography can pattern a greater variety of shapes, including squares, which would have a larger fill factor compared to circular cross section pillars for the same critical dimension. Various non-circular geometries can also be used to improve the area moment of inertia, which will increase the stiffness of the nanowires, thus allowing for higher aspect ratio pillars and larger surface area to projected unit area. For obtaining the noble metal (e.g., gold) pattern using the imprinted resist on a silicon wafer, one of three post-imprint and pre-MACE processes can be used, depending on whether the template prints pillars or holes.

Figure 15:
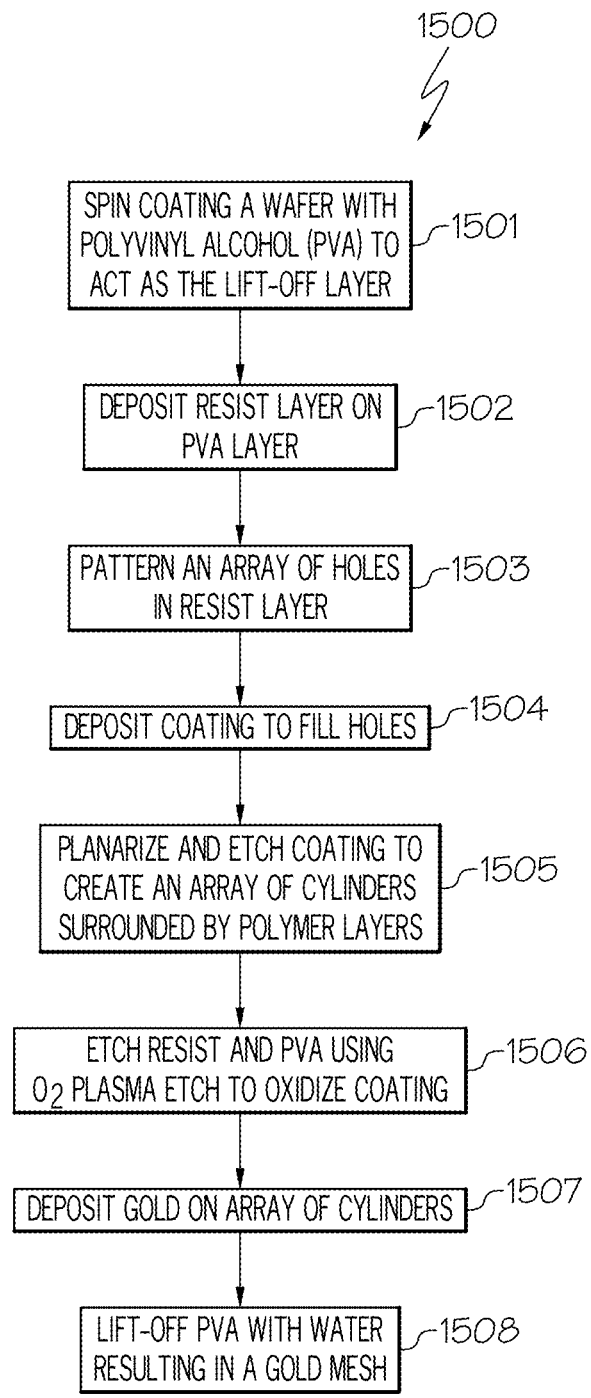
FIG. 15 is a flowchart of a method for performing a bi-layer lift-off using a template that prints holes in the resist in accordance with an embodiment of the present invention.

The first method is a bilayer lift-off based process using a template that prints holes in the resist with a high degree of geometric shape precision as discussed below in connection with FIGS. 15 and 16A-16D. FIG. 15 is a flowchart of a method 1500 for performing a bi-layer lift-off using a template that prints holes in the resist in accordance with an embodiment of the present invention. FIG. 15 will be discussed below in conjunction with FIGS. 16A-16D which depict cross-sectional views of performing a bi-layer lift-off using a template that prints holes in the resist using the steps described in FIG. 15 in accordance with an embodiment of the present invention.

Figure 16A:
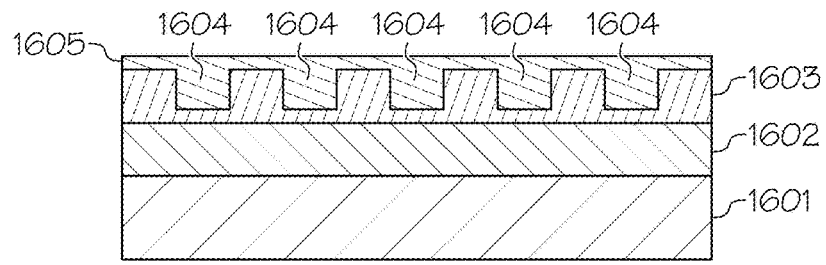
FIGS. 16A-16D depict cross-sectional views of performing a bi-layer lift-off using a template that prints holes in the resist using the steps described in FIG. 15 in accordance with an embodiment of the present invention.

Referring to FIG. 15, in step 1501, the wafer 1601 (e.g., silicon wafer) is spin coated with polyvinyl alcohol (PVA) 1602 (a sacrificial polymeric layer) to act as the lift-off layer later in the process as shown in FIG. 16A.

In step 1502, a resist layer 1603 is deposited on PVA layer 1602 as shown in FIG. 16A.

In step 1503, an array of holes 1604 is patterned in resist layer 1603 as shown in FIG. 16A. That is, resist layer 1603 is imprinted with a hole tone.

In step 1504, a silicon organic coating 1605, such as a Si-containing UV-curable monomer (e.g., Silspin™), is deposited so that these holes 1604 are filled as shown in FIG. 16A.

Figure 16B:
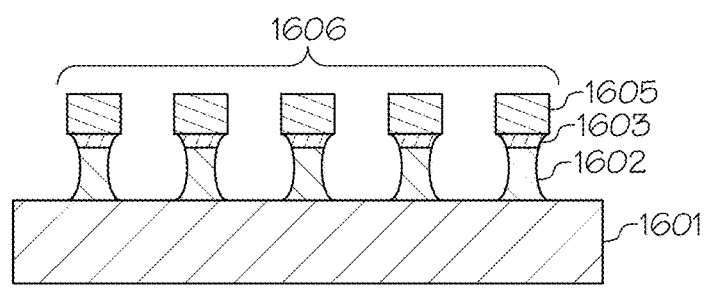

In step 1505, coating 1605 is planarized and etched back to create an array of cylinders 1606 as shown in FIGS. 16A and 16B. In one embodiment, coating 1605 (e.g., Silspin™) is etched back by using a $CHF_3$ and $O_2$ etch to create an array of Silspin™ cylinders 1606 surrounded by polymer.

At this point, cylinders 1606 are surrounded by polymer layers (e.g., resist 1603, PVA 1602). As a result, in step 1506, resist 1603 and PVA 1602 are etched using an oxygen plasma etch to oxidize coating 1605 as shown in FIG. 16B. For example, the polymer layers can then be etched in plasma $O_2$ to oxidize coating 1605 (e.g., Silspin™) which acts like a hard mask for the isotropic etch of the polymer. This etch creates overhangs essential to creating sharp edges during the gold deposition (discussed below) using PVD, for example, e-beam evaporation, to create a disconnection between the metal on top of the polymeric features and the metal that is located at the bottom of the feature and in contact with the silicon (1601). This disconnection facilitates lift-off. In one embodiment, approximately ~2 nm of titanium can be used as an adhesion layer to avoid gold delamination during lift-off. In one embodiment, such a metal may be deposited via PVD to promote adhesion.

Figure 16C:
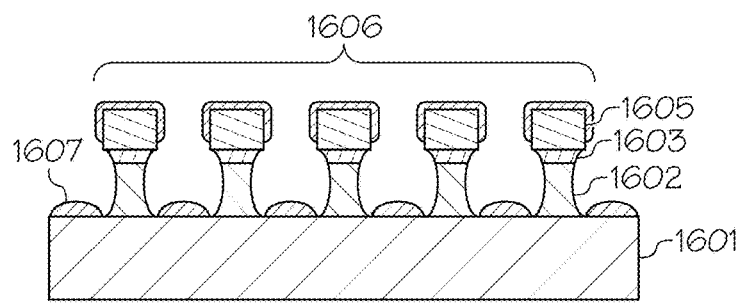

In step 1507, a metal 1607, such as gold, silver, platinum, rhodium, copper and palladium, is deposited on the array of cylinders 1606 as shown in FIG. 16C, such as via PVD. FIG. 16C specifically illustrates the deposition of gold on the array of cylinders 1606.

Figure 16D:
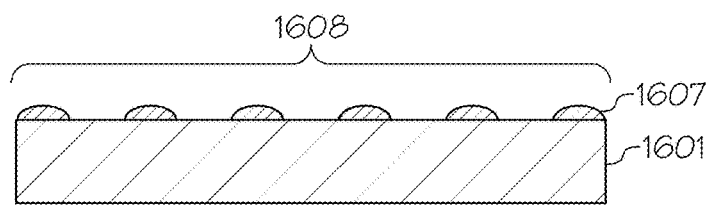

In step 1508, PVA 1602 is lifted off with water resulting in the gold mesh 1608 shown in FIG. 16D. The resulting gold mesh 1608 fabricated using this bi-layer lift-off process can reproduce template features, substantially retaining the shape. The resulting nanowires fabricated after performing MACE thus replicate the template features.

Figure 17:
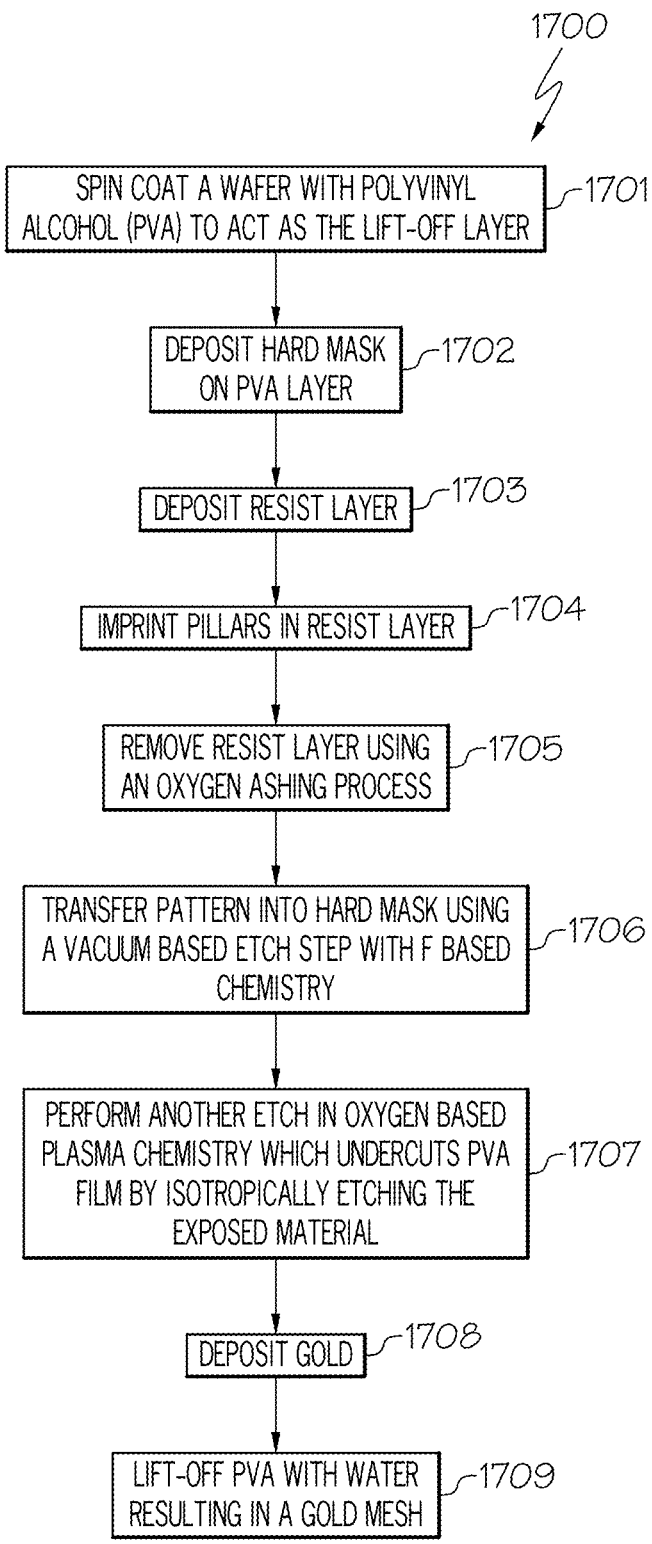
FIG. 17 is a flowchart of a method for performing a reverse tone bi-layer lift-off process with resist pillars as opposed to holes in accordance with an embodiment of the present invention.

The second method is a reverse tone bi-layer lift-off process for templates that print holes as discussed below in connection with FIGS. 17 and 18A-18D. FIG. 17 is a flowchart of a method 1700 for performing a reverse tone bi-layer lift-off process with resist pillars as opposed to holes in accordance with an embodiment of the present invention. FIG. 17 will be discussed below in conjunction with FIGS. 18A-18D which depict cross-sectional views of performing a reverse tone bi-layer lift-off process with resist pillars using the steps described in FIG. 17 in accordance with an embodiment of the present invention.

Figure 18A:
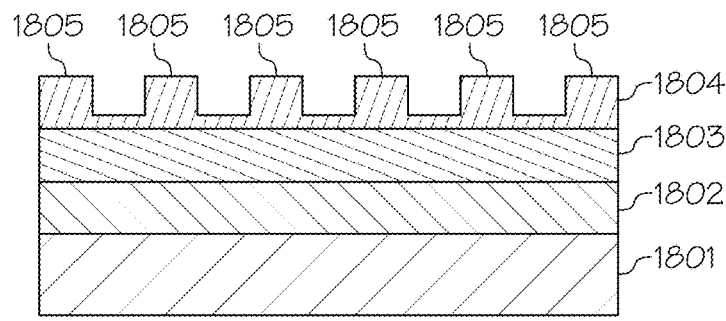
FIGS. 18A-18D depict cross-sectional views of performing a reverse tone bi-layer lift-off process with resist pillars using the steps described in FIG. 17 in accordance with an embodiment of the present invention.

Referring to FIG. 17, in step 1701, the wafer 1801 (e.g., silicon wafer) is spin coated with polyvinyl alcohol (PVA) 1802 (a sacrificial polymeric layer) to act as the lift-off layer later in the process as shown in FIG. 18A.

In step 1702, a hard mask 1803 (sacrificial inorganic layer) (e.g., silicon dioxide ($SiO_2$), silicon nitride) is deposited on the film of PVA 1802 coated on the silicon wafer 1801. In one embodiment, an adhesion promoting layer of materials, such as Transpin™, is spin-coated on hard mask 1803 following which imprint lithography is carried out. Such In step 1703, a resist layer 1804 is deposited.

In step 1704, pillars 1805 are imprinted in resist layer 1804 as shown in FIG. 18A.

Figure 18B:
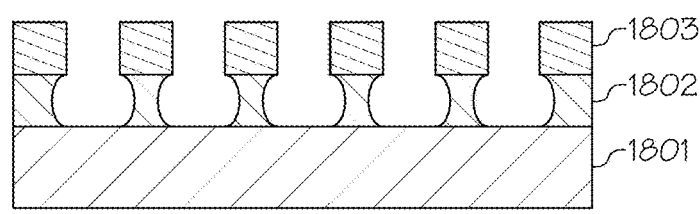

In step 1705, resist layer 1804 is removed using an oxygen ashing process as shown in FIG. 18B.

In step 1706, the pattern is transferred into hard mask 1803 using a vacuum based etch step with fluorine (F) based chemistry as shown in FIG. 18B.

In step 1707, a further etch is performed in oxygen based plasma chemistry which does not attack hard mask 1803 but undercuts PVA film 1802 by isotropically etching the exposed material as shown in FIG. 18B.

Figure 18C:
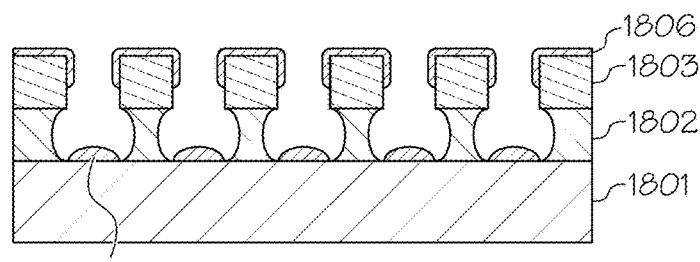

In step 1708, a metal 1806, such as gold, silver, platinum, rhodium, copper and palladium, is deposited, such as via e-beam evaporation or other PVD, as shown in FIG. 18C. FIG. 18C specifically illustrates the deposition of gold. Because of the undercut PVA film 1802, gold layer 1806 is not a blanket coating, but rather a discontinuous film with gold islands on top of the hard mask pillars and a contiguous "mesh" of gold in contact with silicon wafer 1801 as shown in FIG. 18C.

Figure 18D:
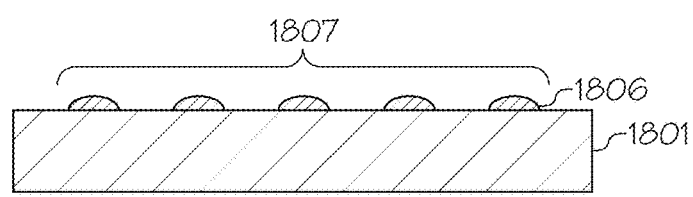

In step 1709, PVA 1802 is lifted off with water resulting in the gold mesh 1807 shown in FIG. 18D. The resulting gold mesh 1807 fabricated using this bi-layer lift-off process can reproduce template features, substantially retaining the shape. The resulting nanowires fabricated after performing MACE thus replicate the template features.

Figure 19:
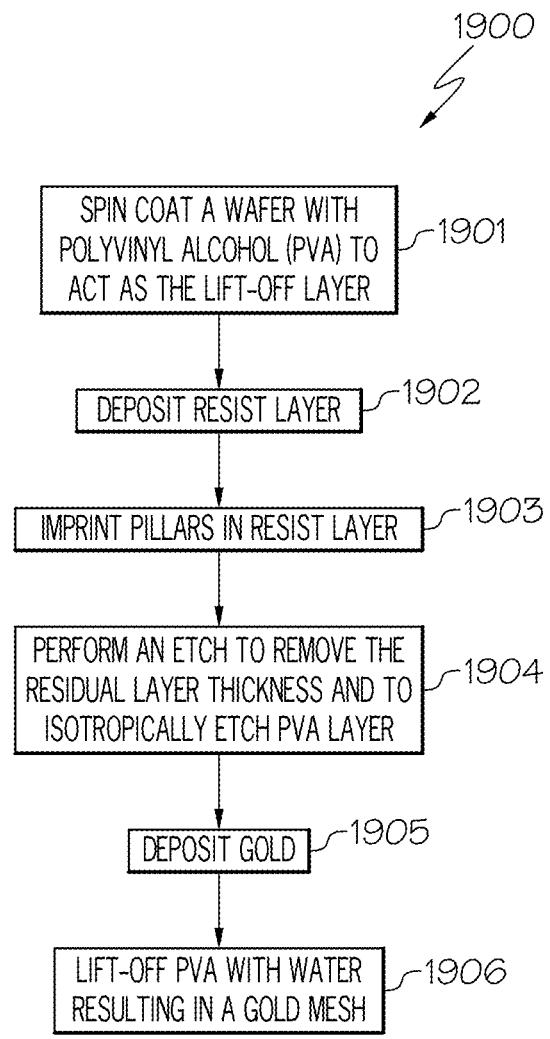
FIG. 19 is a flowchart of a method for performing a simplified bi-layer lift-off process in accordance with an embodiment of the present invention.

The third method is a simplified bi-layer lift-off process as discussed below in connection with FIGS. 19 and 20A-20D. FIG. 19 is a flowchart of a method 1900 for performing a simplified bi-layer lift-off process where the $SiO_2$ hard mask is not used and the selectivity between the imprint resist and PVA only needs one polymer etch to create a sufficient overhang for the gold deposition in accordance with an embodiment of the present invention. FIG. 19 will be discussed below in conjunction with FIGS. 20A-20D which depict cross-sectional views of performing a simplified bi-layer lift-off process using the steps described in FIG. 19 in accordance with an embodiment of the present invention.

Figure 20A:
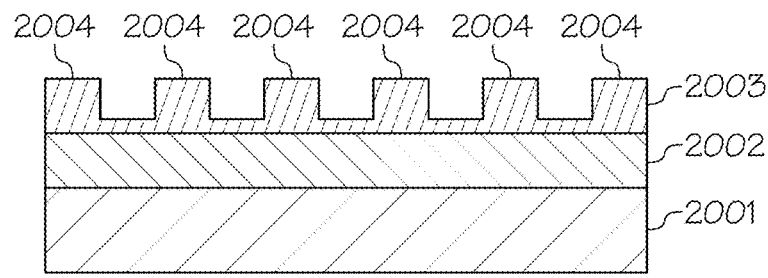
FIGS. 20A-20D depict cross-sectional views of performing a simplified bi-layer lift-off process using the steps described in FIG. 19 in accordance with an embodiment of the present invention.

Referring to FIG. 19, in step 1901, the wafer 2001 (e.g., silicon wafer) is spin coated with polyvinyl alcohol (PVA) 2002 (a sacrificial polymeric layer) to act as the lift-off layer later in the process as shown in FIG. 20A.

In step 1902, a resist layer 2003 is deposited.

In step 1903, pillars 2004 are imprinted in resist layer 2003 as shown in FIG. 20A.

Figure 20B:
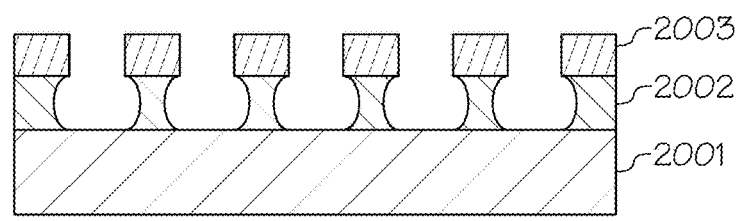

In step 1904, an etch is performed to remove the residual layer thickness and to isotropically etch PVA layer 2002 as shown in FIG. 20B.

Figure 20C:
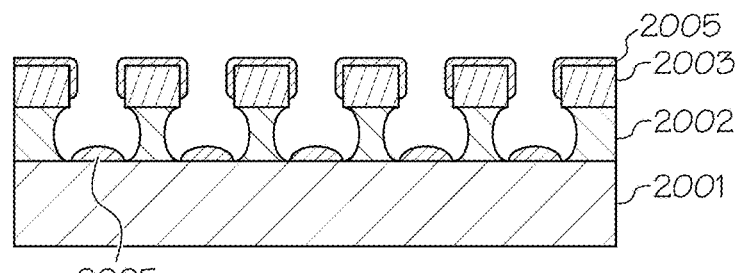

In step 1905, a metal 2005, such as gold, silver, platinum, rhodium, copper and palladium, is deposited, such as via e-beam evaporation or other PVD, as shown in FIG. 20C. FIG. 20C specifically illustrates the deposition of gold. Because of the undercut PVA film 2002, gold layer 2005 is not a blanket coating, but rather a discontinuous film with gold islands on top of the hard mask pillars and a contiguous "mesh" of gold in contact with silicon wafer 2001 as shown in FIG. 20C.

Figure 20D:
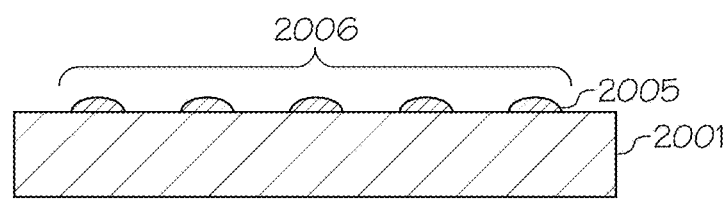

In step 1906, PVA 2002 is lifted off with water resulting in the gold mesh 2006 shown in FIG. 20D. The resulting gold mesh 2006 fabricated using this bi-layer lift-off process can reproduce template features, substantially retaining the cross-section shape. The resulting nanowires fabricated after performing MACE thus replicate the template features.

Figure 21:
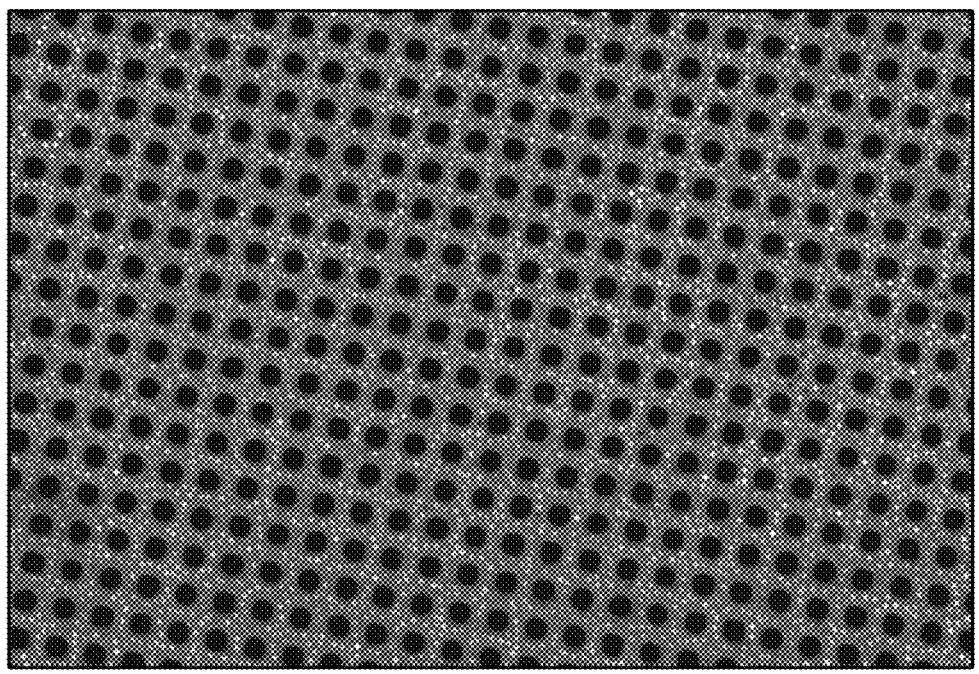
FIG. 21 illustrates the gold mesh with circular holes created using the method of FIG. 19 in accordance with an embodiment of the present invention.

The results of method 1900 are shown below in FIGS. 21, 22A-22B, 23 and 24A-24B. FIG. 21 illustrates the gold mesh with circular holes created using method 1900 in accordance with an embodiment of the present invention, where the scale bar is 200 nanometers.

Figure 22A:
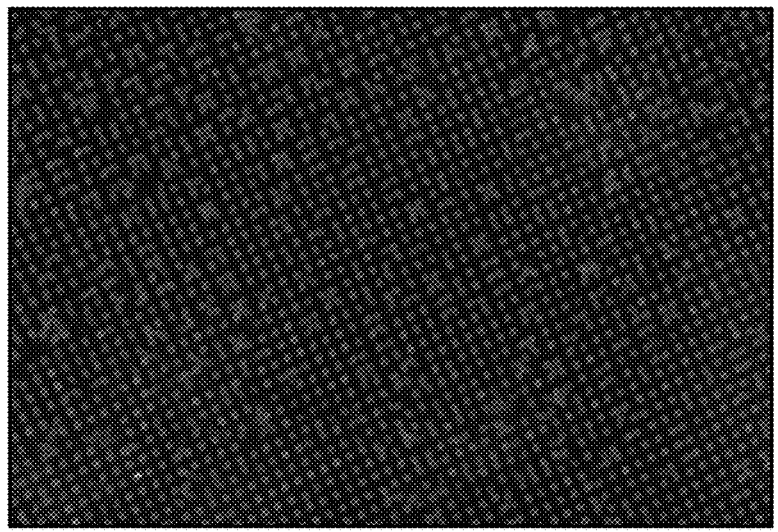
FIG. 22A illustrates the top down SEM of the pillars etched using the simplified circular mesh in accordance with an embodiment of the present invention.

FIG. 22A illustrates the top down SEM of the pillars etched using the simplified circular mesh in accordance with an embodiment of the present invention, where the scale bar is 1 micrometer.

Figure 22B:
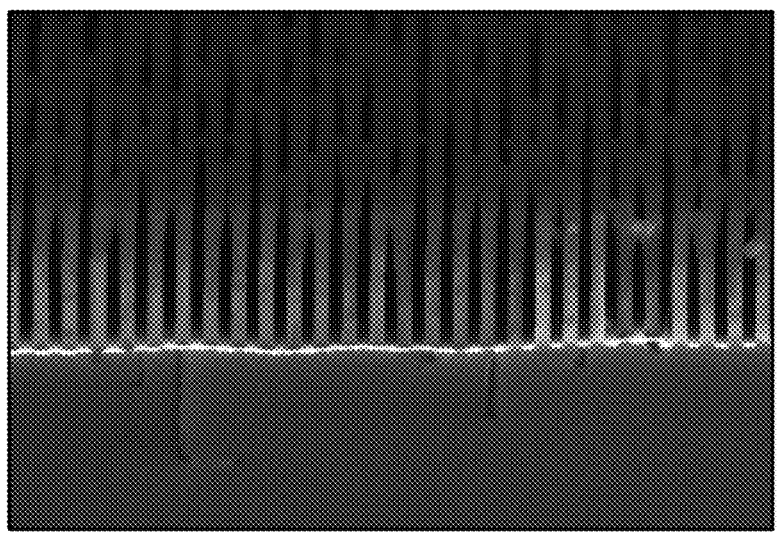
FIG. 22B illustrates the cross-section of the SEM of the pillars etched using the simplified circular mesh in accordance with an embodiment of the present invention.

FIG. 22B illustrates the cross-section of the SEM of the pillars etched using the simplified circular mesh in accordance with an embodiment of the present invention, where the scale bar is 200 nanometers.

Figure 23:
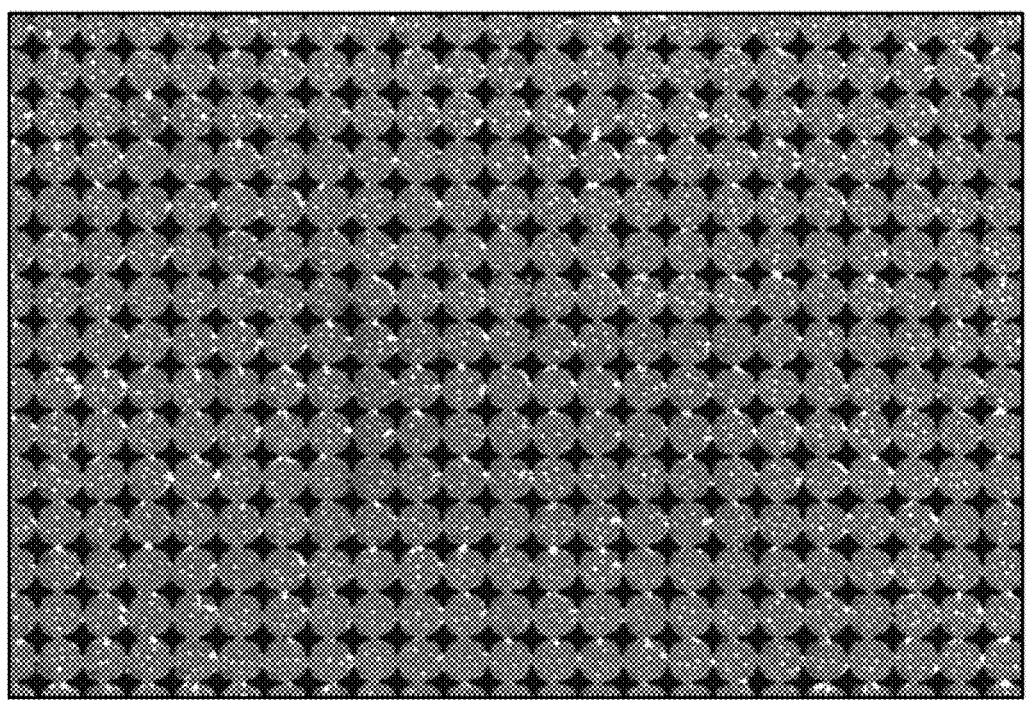
FIG. 23 illustrates the gold mesh with diamond holes created using the method of FIG. 19 in accordance with an embodiment of the present invention.

FIG. 23 illustrates the gold mesh with diamond holes created using method 1900 in accordance with an embodiment of the present invention, where the scale bar is 200 nanometers.

Figure 24A:
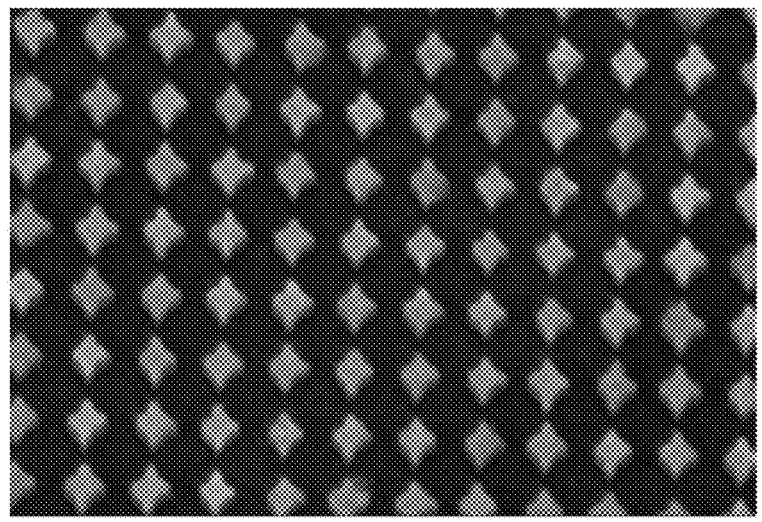
FIG. 24A illustrates the top down SEM of the pillars etched using the simplified diamond mesh in accordance with an embodiment of the present invention.

FIG. 24A illustrates the top down SEM of the pillars etched using the simplified diamond mesh in accordance with an embodiment of the present invention, where the scale bar is 100 nanometers.

Figure 24B:
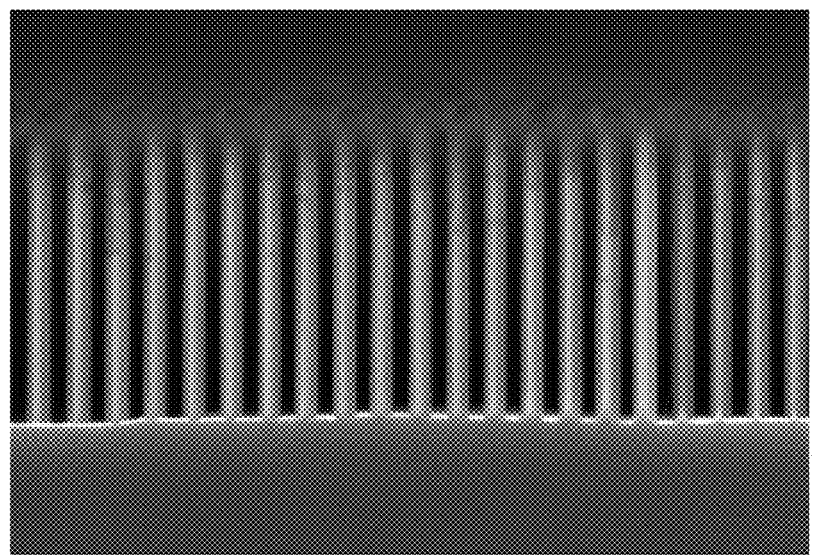
FIG. 24B illustrates the cross-section of the SEM of the pillars etched using the simplified diamond mesh in accordance with an embodiment of the present invention.

FIG. 24B illustrates the cross-section of the SEM of the pillars etched using the simplified diamond mesh in accordance with an embodiment of the present invention, where the scale bar is 200 nanometers.

An exemplary application using ultracapacitors is discussed below in connection with FIGS. 25 and 26A-26E.

Figure 25:
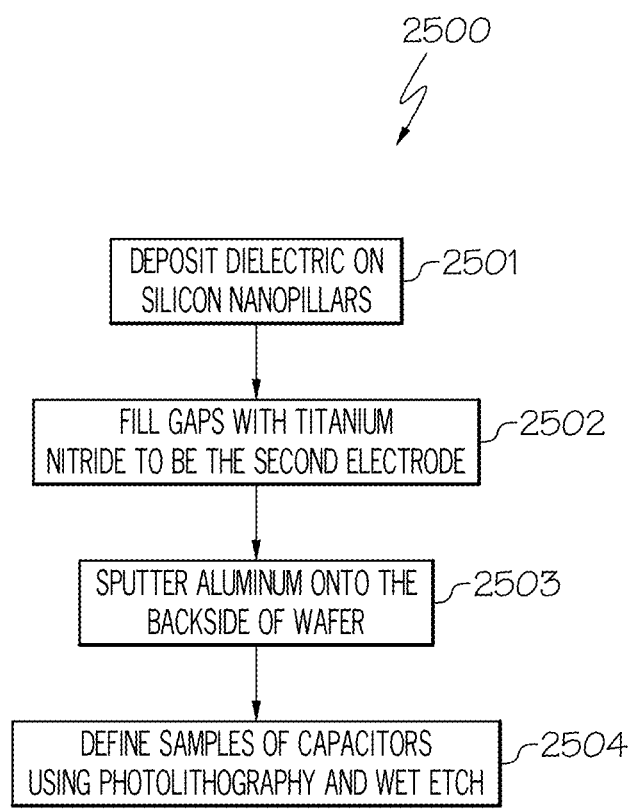
FIG. 25 is a flowchart of a method for fabricating an ultra-capacitor from nanowires in accordance with an embodiment of the present invention.

FIG. 25 is a flowchart of a method 2500 for fabricating an ultra-capacitor from nanowires in accordance with an embodiment of the present invention. FIG. 25 will be discussed below in conjunction with FIGS. 26A-26E which depict cross-sectional views of fabricating an ultra-capacitor from nanowires using the steps described in FIG. 25 in accordance with an embodiment of the present invention.

Figure 26A:
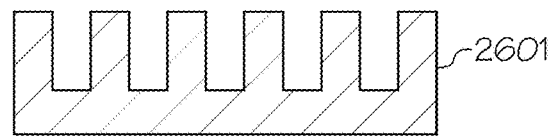
FIGS. 26A-26E depict cross-sectional views of fabricating an ultra-capacitor from nanowires using the steps described in FIG. 25 in accordance with an embodiment of the present invention.
Figure 26B:
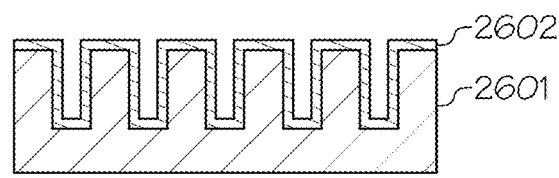

Referring to FIG. 25, in step 2501, a dielectric 2602 is deposited on silicon nanopillars 2601 as shown in FIGS. 26A-26B. For example, in one embodiment, approximately 11 nm of hafnium dioxide, the dielectric 2602, is deposited using atomic layer deposition (ALD).

Figure 26C:
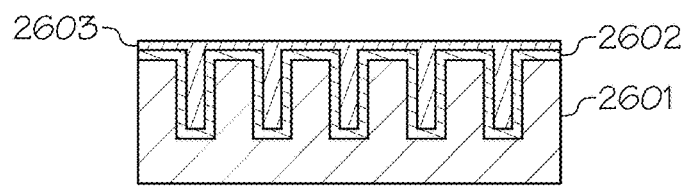

In step 2502, the gaps are filled with titanium nitride 2603 to be the second electrode as shown in FIG. 26C. In one embodiment, the gaps are filled with 50 nm of titanium nitride to be the second electrode.

Figure 26D:
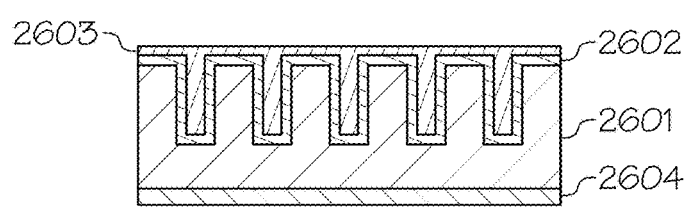

In step 2503, aluminum 2604 is sputtered onto the backside of the wafer as shown in FIG. 26D. Aluminum was sputtered onto the backside of the wafer to create a better contact for the measurements.

Figure 26E:
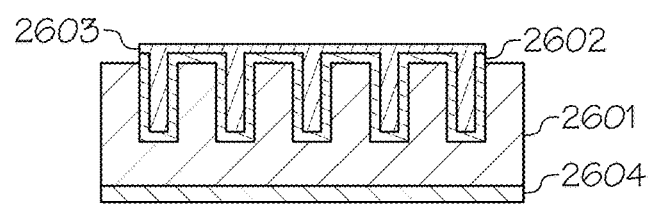

In step 2504, samples of capacitors are defined using photolithography and wet etch as shown in FIG. 26E. In one embodiment, the sample was divided into 300 µm by 300 µm capacitors by using photolithography to define separate samples for testing with a CV probe station. In general, silicon nanoshapes can enable important applications in energy, healthcare and electronics, such as nanowire sensors for gaseous, biological and chemical species detection, battery anodes, ultra-capacitors, thermoelectrics, nanowire FETs and nanoantennae. The large surface area to volume ratio (large surface areas per unit projected area) of shaped nanopillars can improve critical properties, such as sensor sensitivity, capacitor and battery storage capacity. Shaped nanopillars can be tailored to have greater effective surface area as compared to their cylindrical counterparts.

If necessary, nanowires can also be harvested after MACE processing by pouring a PolyDimethylsiloxane (PDMS) mold onto the substrate, curing the PDMS, peeling the PDMS layer off, dissolving the PDMS, and separating out the nanowires with either filtration or chemical separation. Peeling the PDMS layer off can be done by sonicating the wafer or by mechanically initiating a crack at the PDMS/substrate interface at the edge of the substrate with a thin blade and following the crack propagation with the edge of the blade. With enough shear force and bending moment applied to the base of the nanowires during peel-off by either the blade or the sonication process, the nanowires can be detached from the substrate and retained within the PDMS mold. That is, nanowires may be sheared form the wafer using mechanical or acoustic forces. If the gold mesh remains in good fidelity after peel off, the silicon substrate can be used again for subsequent MACE processes. Any excess PDMS on the silicon surface can be cleaned using wet chemistries involving appropriate solvents or Piranha solution. Thus, one silicon wafer can theoretically be processed several times in this way to produce nanowires. The nanowires can be collected in solution and either stored as colloids or isolated as a powder by evaporating the solvent medium.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for template fabrication of ultra-precise nanoscale shapes, the method comprising:
    forming structures with a smooth shape on a substrate using lithography;
    subjecting said structures to an atomic layer deposition of one or more films leading to nanoscale sharp shapes with features that exceed lithography resolution capability of sub-10 nm resolution;
    performing a resist imprint of said nanoscale sharp shapes using imprint lithography; and
    etching said nanoscale sharp shapes into underlying functional films on said substrate forming a nanoshaped template with nanoscale sharp shapes that comprise one or more of the following: sharp corners and ultra-small gaps ranging from 1 to 10 nanometers.

2. The method as recited in claim 1, wherein said structures comprise circular or elliptical cross-section pillars.

3. The method as recited in claim 1, wherein said substrate comprises a fused silica substrate.

4. The method as recited in claim 1, wherein said underlying functional films comprise thermal oxide.

5. The method as recited in claim 1, wherein said nanoscale sharp shapes are diamond-like shapes.

6. The method as recited in claim 1, wherein said nanoshaped template with nanoscale sharp shapes is utilized in magnetic memory, nanophotonic devices or biomedical applications.

7. The method as recited in claim 1, wherein said lithography comprises one of the following: electron beam lithography, ion beam lithography and multiphoton lithography.

8. The method as recited in claim 1, wherein said one or more films comprises a dielectric interleaved with a deposition of a conductive film.

9. The method as recited in claim 1, wherein said imprint lithography comprises Jet and Flash Imprint Lithography (J-FIL).

10. The method as recited in claim 1, wherein said one or more films comprise two or more films comprising a dielectric and a conducting film.

11. The method as recited in claim 10, wherein said dielectric comprises one of the following: silicon dioxide and silicon nitride, wherein said conducting film comprises titanium nitride.

12. The method as recited in claim 1, wherein said nanoshaped template is pre-compensated to account for pattern degradation of shape during said etching.

13. The method as recited in claim 12, wherein said nanoshaped template is pre-compensated by using a nanoscale bridge that connects adjacent nanoscale sharp shapes.

14. A method for template replication of ultra-precise nanoscale shapes, the method comprising:
using a master template for patterning of imprint material on a residual layer that is positioned on a dissolvable layer which is positioned on a substrate;
depositing a dielectric layer over said imprint material and said residual layer to capture shape details;
performing one of chemical vapor deposition, physical vapor deposition and atomic layer deposition of said deposited dielectric layer to create a film over said imprint material and said residual layer;
planarizing said film;
bonding a replica substrate onto said planarized film;
eliminating said dissolvable layer followed by flipping over a structure comprising said imprint material, said residual layer and said substrate; and
removing said imprint material thereby forming a replica template.

15. The method as recited in claim 14, wherein said dissolvable layer has a thickness between 1 and 20 micrometers.

16. The method as recited in claim 14, wherein said imprint material is removed using an oxidizing cleaning technique.

17. The method as recited in claim 14, wherein said dissolvable layer is eliminated in a liquid bath.

18. The method as recited in claim 17 further comprising:
drying said structure comprising said imprint material, said residual layer and said substrate after eliminating said dissolvable layer in said liquid bath.

19. A method to fabricate shaped cross-section silicon nanowires, the method comprising:
depositing a sacrificial polymeric layer on a silicon;
imprinting on said sacrificial polymeric layer using a nanoscale shaped template;
etching a polymeric residual layer resulting from said imprinting;
etching an underlying sacrificial polymeric layer following said etching of said polymeric residual layer, wherein said underlying sacrificial polymeric layer etch results in an undercut;
performing a physical vapor deposition of a metal;
removing said sacrificial polymeric layer to create nanoshaped metal structures on said silicon; and
performing a metal assisted chemical etching process to create nanowires.

20. The method as recited in claim 19, wherein said metal comprises one of the following: gold, silver, platinum, rhodium, copper and palladium.

21. The method as recited in claim 19, wherein a cross-section of said nanoshaped metal structures allows for enhanced surface area of said silicon per unit projected area of said silicon.

22. The method as recited in claim 19 further comprising:
depositing a sacrificial inorganic layer between said sacrificial polymeric layer and said polymeric residual layer.

23. The method as recited in claim 22, wherein said sacrificial inorganic layer comprises one of the following: silicon dioxide and silicon nitride.

24. The method as recited in claim 19, wherein said nanowires are harvested by casting said nanowires in a polymer and shearing said nanowires from a wafer.

25. The method as recited in claim 24, wherein said shearing of said nanowires is performed using mechanical or acoustic forces.

26. A method to fabricate shaped cross-section silicon nanowires, the method comprising:
depositing a sacrificial polymeric layer on a silicon;
imprinting on said sacrificial polymeric layer using a nanoscale shaped template;
coating said sacrificial polymeric layer with a silicon organic coating;
planarizing and etching said silicon organic coating in a plasma involving fluorine and oxygen;
etching an underlying sacrificial polymeric layer, wherein said underlying sacrificial polymeric layer etch results in an undercut;
performing a physical vapor deposition of a metal to promote adhesion;
performing a physical vapor deposition of a second metal;
removing said sacrificial polymeric layer to create nanoshaped metal structures on said silicon; and
performing a metal assisted chemical etching process to create nanowires.

27. The method as recited in claim 26, wherein said second metal comprises one of the following: gold, silver, platinum, rhodium, copper and palladium.

28. The method as recited in claim 26, wherein a cross-section of said nanoshaped metal structures allows for enhanced surface area of said silicon per unit projected area of said silicon.

29. The method as recited in claim 26, wherein said nanowires are harvested by casting said nanowires in a polymer and shearing said nanowires from a wafer.

30. The method as recited in claim 29, wherein said shearing of said nanowires is performed using mechanical or acoustic forces.

* * * * *